(12) United States Patent
Elie et al.

(10) Patent No.: US 10,151,132 B2
(45) Date of Patent: Dec. 11, 2018

(54) POWER MANAGEMENT FOR VEHICLE DOOR SYSTEM

(71) Applicant: Ford Global Technologies, LLC, Dearborn, MI (US)

(72) Inventors: Larry Dean Elie, Ypsilanti, MI (US); John Wayne Jaranson, Dearborn, MI (US); Timothy J. Potter, Dearborn, MI (US); Robert F. Novak, Farmington Hills, MI (US); Jeff A. Wallace, Walled Lake, MI (US); Michael M. Azzouz, Livonia, MI (US); Gerald J. Heath, Allen Park, MI (US); Evangelos P. Skoures, Detroit, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 60 days.

(21) Appl. No.: 15/056,215

(22) Filed: Feb. 29, 2016

(65) Prior Publication Data

US 2017/0247927 A1    Aug. 31, 2017

(51) Int. Cl.
*E05F 15/60*   (2015.01)
*B60J 5/04*    (2006.01)
(Continued)

(52) U.S. Cl.
CPC ............. *E05F 15/60* (2015.01); *B60J 5/04* (2013.01); *B60Q 9/00* (2013.01); *B60R 16/03* (2013.01);
(Continued)

(58) Field of Classification Search
None
See application file for complete search history.

(56) References Cited

U.S. PATENT DOCUMENTS 2,721,353 A    10/1955   Mackintosh
2,915,777 A    12/1959   Allen
(Continued)

FOREIGN PATENT DOCUMENTS

CA    2034320 C      11/1994
CN    101403271 A    4/2009
(Continued)

OTHER PUBLICATIONS

Steeven Zeiß, Alexander Marinc, Andreas Braun, Tobias Große-Puppendahl, Sebastian Beck; "A Gesture-based Door Control Using Capacitive Sensors"; Fraunhofer-Institut für Graphische Datenverabeitung IGD: pp. 1-10; date unknown.
(Continued)

*Primary Examiner* — Redhwan K Mawari
*Assistant Examiner* — Edward Torchinsky
(74) *Attorney, Agent, or Firm* — Jason Rogers; Price Heneveld LLP

(57) ABSTRACT

A vehicle door system is disclosed. The system comprises an actuator, a power source, and a controller. The actuator is configured to adjust a position of a door. The controller is configured to control the actuator with energy provided by the power source. The controller is further configured to identify a charge level of the power source and compare the charge level to at least one threshold. In response the charge level being less than the at least one threshold, the controller is configured to output a warning signal.

15 Claims, 12 Drawing Sheets

(51) Int. Cl.
*B60Q 9/00* (2006.01)
*B60R 16/033* (2006.01)
*G01R 31/36* (2006.01)
*B60R 16/03* (2006.01)
*E05F 15/611* (2015.01)
*E05F 15/40* (2015.01)
*E05F 15/73* (2015.01)

(52) U.S. Cl.
CPC .......... *B60R 16/033* (2013.01); *E05F 15/611* (2015.01); *G01R 31/3682* (2013.01); *G01R 31/3693* (2013.01); *E05F 15/40* (2015.01); *E05F 15/73* (2015.01); *E05Y 2400/61* (2013.01); *E05Y 2900/531* (2013.01)

(56) References Cited

U.S. PATENT DOCUMENTS

| | | | |
|---|---|---|---|
| 3,344,554 A | 10/1967 | Misaka et al. | |
| 3,357,137 A | 12/1967 | Lombardi et al. | |
| 3,895,281 A | 7/1975 | Corbaz | |
| 4,078,770 A | 3/1978 | Yates et al. | |
| 4,143,497 A | 3/1979 | Offenbacher | |
| 4,386,398 A | 5/1983 | Matsuoka et al. | |
| 4,441,376 A | 4/1984 | Tobey | |
| 4,488,753 A | 12/1984 | Koike | |
| 4,497,137 A | 2/1985 | Nelson | |
| 4,501,012 A | 2/1985 | Kishi et al. | |
| 4,501,090 A | 2/1985 | Yoshida et al. | |
| 4,674,230 A | 6/1987 | Takeo et al. | |
| 4,727,679 A | 3/1988 | Kombrekke et al. | |
| 4,763,111 A | 8/1988 | Matsuo et al. | |
| 4,899,945 A | 2/1990 | Jones | |
| 4,952,080 A | 8/1990 | Boiucaner et al. | |
| 5,072,973 A * | 12/1991 | Gudgel | E05C 17/28 |
| | | | 292/201 |
| 5,236,234 A | 8/1993 | Norman | |
| 5,317,835 A | 6/1994 | Dupuy et al. | |
| 5,355,628 A | 10/1994 | Dranchak | |
| 5,369,911 A | 12/1994 | Fortunato | |
| 5,396,158 A | 3/1995 | Long et al. | |
| 5,434,487 A | 7/1995 | Long et al. | |
| 5,787,636 A | 8/1998 | Buchanan, Jr. | |
| 5,801,340 A | 9/1998 | Peter | |
| 5,913,763 A | 6/1999 | Beran et al. | |
| 6,065,185 A | 5/2000 | Breed et al. | |
| 6,145,354 A | 11/2000 | Kondo et al. | |
| 6,247,271 B1 | 6/2001 | Fioritto et al. | |
| 6,275,231 B1 | 8/2001 | Obradovich | |
| 6,305,737 B1 | 10/2001 | Corder et al. | |
| 6,341,807 B2 | 1/2002 | Cetnar et al. | |
| 6,370,732 B1 | 4/2002 | Yezersky et al. | |
| 6,401,392 B1 | 6/2002 | Yuge | |
| 6,435,575 B1 | 8/2002 | Pajak et al. | |
| 6,442,902 B1 | 9/2002 | Van Den Oord | |
| 6,498,970 B2 | 12/2002 | Colmenarez et al. | |
| 6,624,605 B1 | 9/2003 | Powder et al. | |
| 6,777,958 B2 | 8/2004 | Haag et al. | |
| 6,928,694 B2 | 8/2005 | Breed et al. | |
| 7,034,682 B2 | 4/2006 | Beggs et al. | |
| 7,045,764 B2 | 5/2006 | Beggs et al. | |
| 7,068,146 B2 | 6/2006 | Sasaki et al. | |
| 7,132,642 B2 | 11/2006 | Shank et al. | |
| 7,175,227 B2 | 2/2007 | Menard | |
| 7,193,509 B2 | 3/2007 | Bartels et al. | |
| 7,215,529 B2 | 5/2007 | Rosenau | |
| 7,273,207 B2 | 9/2007 | Studer | |
| 7,280,035 B2 | 10/2007 | McLain et al. | |
| 7,320,497 B2 | 1/2008 | Zinn et al. | |
| 7,342,373 B2 | 3/2008 | Newman et al. | |
| 7,377,557 B2 | 5/2008 | Shelley et al. | |
| 7,400,153 B2 | 7/2008 | Shoji et al. | |
| 7,438,346 B1 | 10/2008 | Breed | |
| 7,439,632 B2 | 10/2008 | Ogino et al. | |
| 7,538,506 B2 | 5/2009 | Zinn et al. | |
| 7,686,378 B2 | 3/2010 | Gisler et al. | |
| 7,688,179 B2 | 3/2010 | Kurpinski et al. | |
| 7,874,609 B2 | 1/2011 | Whinnery | |
| 7,886,409 B2 | 2/2011 | Yip | |
| 8,077,022 B2 | 12/2011 | Baruco et al. | |
| 8,132,844 B2 | 3/2012 | Sonnek et al. | |
| 8,159,231 B2 | 4/2012 | Sakamaki | |
| 8,169,317 B2 | 5/2012 | Lemerand et al. | |
| 8,186,013 B2 | 5/2012 | Yip | |
| 8,237,544 B2 | 8/2012 | Nakashima | |
| 8,284,022 B2 | 10/2012 | Kachouh | |
| 8,397,581 B2 | 3/2013 | Ruby, III et al. | |
| 8,511,739 B2 | 8/2013 | Brown et al. | |
| 8,615,927 B2 | 12/2013 | Ezzat et al. | |
| 8,641,125 B2 | 2/2014 | Jimenez et al. | |
| 8,651,461 B2 | 2/2014 | Christensen et al. | |
| 9,159,219 B2 * | 10/2015 | Magner | G08C 17/00 |
| 2001/0004164 A1 | 6/2001 | Mattsson | |
| 2002/0039008 A1 | 4/2002 | Edgar et al. | |
| 2003/0038544 A1 | 2/2003 | Spurr | |
| 2003/0222758 A1 | 12/2003 | Willats et al. | |
| 2005/0062453 A1 | 3/2005 | Sato | |
| 2005/0174077 A1 | 8/2005 | Haag et al. | |
| 2005/0242618 A1 | 11/2005 | Menard | |
| 2005/0280284 A1 | 12/2005 | McLain et al. | |
| 2006/0230574 A1 | 10/2006 | Murayama et al. | |
| 2007/0090654 A1 | 4/2007 | Eaton | |
| 2007/0186480 A1 | 8/2007 | Freeman | |
| 2007/0192038 A1 | 8/2007 | Kameyama | |
| 2007/0268132 A1 | 11/2007 | Milo | |
| 2008/0211519 A1 | 9/2008 | Kurumado et al. | |
| 2008/0295408 A1 | 12/2008 | Heissler | |
| 2008/0296927 A1 | 12/2008 | Gisler et al. | |
| 2009/0113797 A1 | 5/2009 | Hoermann | |
| 2009/0153151 A1 | 6/2009 | Cho et al. | |
| 2009/0265992 A1 | 10/2009 | Hass et al. | |
| 2010/0224117 A1 | 9/2010 | Christensen et al. | |
| 2011/0203181 A1 * | 8/2011 | Magner | G08C 17/00 |
| | | | 49/324 |
| 2011/0260848 A1 | 10/2011 | Rodriguez Barros et al. | |
| 2011/0295469 A1 | 12/2011 | Rafii et al. | |
| 2012/0042572 A1 | 2/2012 | Yuge | |
| 2012/0179336 A1 | 7/2012 | Oakley | |
| 2013/0031747 A1 | 2/2013 | Gobart et al. | |
| 2013/0074412 A1 | 3/2013 | Wellborn et al. | |
| 2013/0091768 A1 | 4/2013 | Houser et al. | |
| 2013/0127479 A1 | 5/2013 | Grills et al. | |
| 2013/0138303 A1 | 5/2013 | McKee et al. | |
| 2014/0000165 A1 | 1/2014 | Patel et al. | |
| 2014/0055349 A1 | 2/2014 | Itoh | |
| 2014/0150581 A1 | 6/2014 | Scheuring et al. | |
| 2014/0297060 A1 | 10/2014 | Schmidt et al. | |
| 2014/0373641 A1 | 12/2014 | Sasaki | |
| 2015/0059249 A1 | 3/2015 | Yulkowski | |
| 2017/0247927 A1 * | 8/2017 | Elie | E05F 15/60 |
| 2017/0247933 A1 * | 8/2017 | Elie | B60J 5/04 |
| 2017/0251092 A1 * | 8/2017 | Elie | H04L 67/12 |

FOREIGN PATENT DOCUMENTS

| | | |
|---|---|---|
| CN | 201343938 Y | 11/2009 |
| CN | 202294674 U | 7/2012 |
| CN | 103132847 A | 6/2013 |
| CN | 103269914 A | 8/2013 |
| CN | 203143980 U | 8/2013 |
| CN | 103422764 A | 12/2013 |
| CN | 203551964 U | 4/2014 |
| CN | 203580775 U | 5/2014 |
| DE | 4119579 A1 | 12/1992 |
| DE | 4207706 A1 | 9/1993 |
| DE | 10004161 A1 | 8/2001 |
| DE | 10038803 A1 | 2/2002 |
| DE | 102007062473 A1 | 7/2009 |
| DE | 102013103950 B3 | 5/2014 |
| EP | 0397300 A2 | 11/1990 |
| EP | 2174814 A2 | 4/2010 |
| EP | 1265772 A1 | 12/2010 |
| EP | 2287430 A2 | 2/2011 |
| EP | 1899565 B1 | 10/2011 |

(56) References Cited

FOREIGN PATENT DOCUMENTS

| | | |
|---|---|---|
| EP | 2583848 A2 | 4/2013 |
| EP | 2765112 A1 | 8/2014 |
| FR | 2873074 A1 | 1/2006 |
| GB | 2479157 A | 10/2011 |
| JP | 07285789 A | 10/1995 |
| JP | 2000080828 A | 3/2000 |
| JP | 2000318444 A | 11/2000 |
| JP | 2004176426 A | 6/2004 |
| JP | 2009161959 A | 7/2009 |
| JP | 20100095383 A | 4/2010 |
| JP | 2013007171 A | 1/2013 |
| JP | 2013028903 A | 2/2013 |
| JP | 2014129037 A | 7/2014 |
| JP | 2014148842 A | 8/2014 |
| KR | 20020048811 A | 6/2002 |
| KR | 20130068538 A | 6/2013 |
| WO | WO-2005008007 A1 * | 1/2005 ............... E05F 5/00 |
| WO | 20100098620 A2 | 9/2010 |
| WO | 2011117083 A1 | 9/2011 |
| WO | 2013013313 A1 | 1/2013 |
| WO | 2013074901 A2 | 5/2013 |
| WO | 2013169888 A1 | 11/2013 |
| WO | 2014152907 A1 | 9/2014 |

OTHER PUBLICATIONS

Abd Manan Bin Ahmad; "The Design and Development of a System for Controlling Automotive Functions using Speech Recognition"; Universiti Teknologi Malaysia; pp. 1-100; 2006.

Haleem, M.S.; "Voice Controlled Automation System"; IEEE International; Dept. of Electron. Eng., NED Univ. of Eng. & Technol.; Mulitopic Conference; Print ISBN: 978-1-4244-2823-6; pp. 1-2; Dec. 23-24, 2008.

"InnoTrans 2014: Safety on Vehicle Doors with Non-Touch Detection System from Mayser"; Mayser Safety Technology; pp. 1-1; Aug. 4, 2014.

Bogdan Popa; "How BMWs Soft Close Doors Work"; Autoevolution; pp. 1-6; Aug. 18, 2012.

* cited by examiner

POWER MANAGEMENT FOR VEHICLE DOOR SYSTEM

FIELD OF THE INVENTION

The present disclosure relates to vehicles, and more particularly to vehicles having doors.

BACKGROUND OF THE INVENTION

In an effort to improve vehicle operation and convenience, many manufacturers have introduced a variety of convenience and operating features to vehicles. However, many components and systems of vehicles remain significantly similar to conventional vehicle designs dating back to the previous century. The disclosure provides for various systems and apparatuses to provide for improved operation of at least one door of a vehicle. The systems discussed herein may include doors that either assist a user when accessing the vehicle, and/or configured to open and close without requiring a vehicle user to physically reposition the door. Such systems may provide for improved operation of a vehicle as described herein.

SUMMARY OF THE INVENTION

According to one aspect of the present invention, a vehicle door system is disclosed. The system comprises an actuator, a power source, and a controller. The actuator is configured to adjust a position of a door. The controller is configured to control the actuator with energy provided by the power source. The controller is further configured to identify a charge level of the power source and compare the charge level to at least one threshold. In response the charge level being less than the at least one threshold, the controller is configured to output a warning signal.

According to another aspect of the present invention, vehicle door control system is disclosed. The control system comprises a door actuator and a controller. The door actuator is in communication with a power supply, and the controller is configured to control the door actuator. The controller is configured to identify a charge level of the power supply. In response to the charge level being less than a first threshold, the controller is configured to control the door actuator to move the door in an oscillating motion.

According to yet another aspect of the present invention, a vehicle control system is disclosed. The control system comprises a central supply, an actuator, and at least one controller. The central supply is configured to supply power to the vehicle. The actuator configured to control a position of a door and in communication with a secondary supply. The controller is configured to control the actuator with power from the secondary supply. The controller is further configured to detect a level of the central supply. In response to the level of the central supply being less than a threshold, the controller is configured to supply power from the secondary supply to the central supply.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present disclosure are disclosed herein. However, it is to be understood that the disclosed embodiments are merely exemplary of the disclosure that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present disclosure.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

Figure 1:
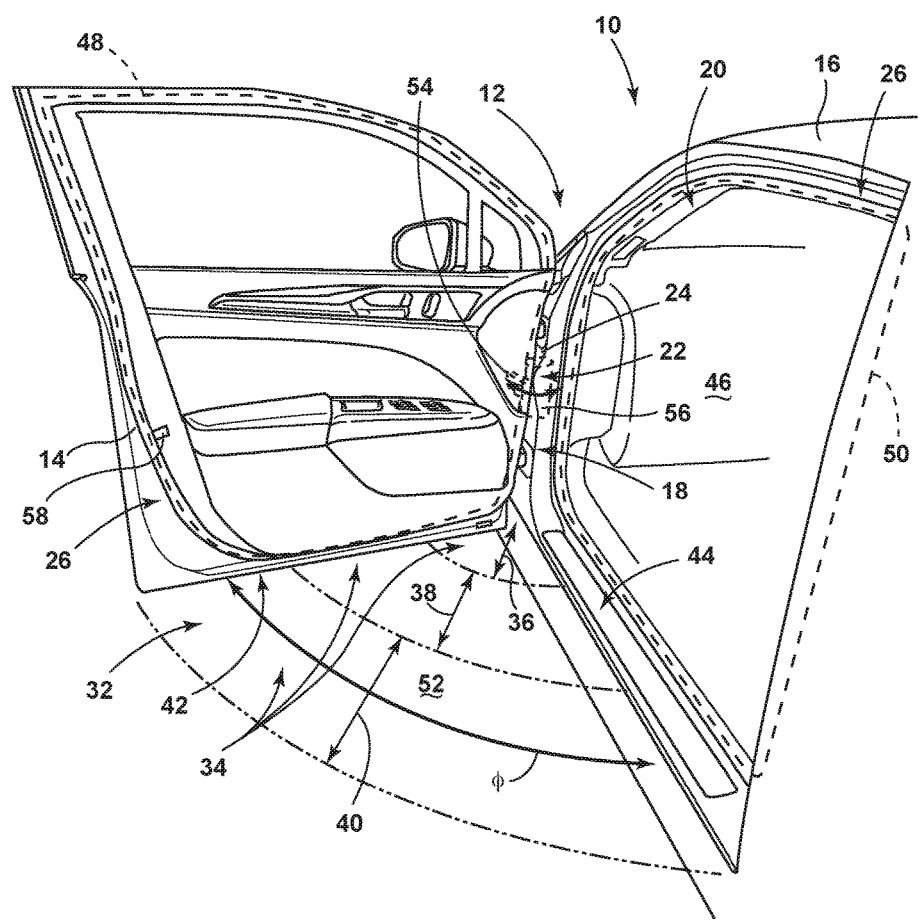
FIG. 1 is a projected view of a vehicle comprising a door assist system configured to detect an object or obstruction in an inner swing path of the door.

Referring to FIG. 1, a projected view of a vehicle 10 includes a door opening 20, a door 14 mounted adjacent the opening 20 and moveable relative to the opening 20 between a closed position and a range of open positions. The vehicle 10 also includes a controller that determines whether an instantaneous door position is the closed position or is within the range of open positions and prevents vehicle movement, engine ignition, or both in response to the door 14 being detected as positioned within the range of open positions. The controller is further discussed in various portions of the disclosure and denoted as the controller 70 in FIGS. 2, 3, 4, and 11.

An actuator 22 is in communication with a controller (shown in FIG. 2) configured to detect and control the angular position ϕ of the door 14. In an embodiment, the actuator 22 may be a power assist device that is disposed adjacent to the door 14 and is operably and structurally coupled to the door 14 for assisting in moving the door 14 between open and closed positions, as further described below. The actuator 22 is coupled to the door 14 for movement therewith and is operably coupled to the hinge assembly 18 for powering the movement of the door 14. The actuator 22 may include a motor, which is contemplated to be an electric motor, power winch, slider mechanism or other actuator mechanism having sufficient power necessary to provide the torque required to move the door 14 between open and closed positions, as well as various detent locations. Thus, the motor is configured to act on the door 14 at or near the hinge assembly 18 in a pivoting or rotating manner. The controller may comprise a motor control unit comprising a feedback control system configured to accurately position the door 14 about the hinge assembly 18 in a smooth and controlled motion path. The controller may further be in communication with a door position sensor 24 as well as at least one interference sensor 26. The door position sensor 24 may be configured to identify an angular position of the door 14 and the interference sensor 26 may be configured to identify a potential obstruction which may be contacted by the door 14. Further details regarding the controller are discussed in reference to FIG. 11 of the disclosure.

The actuator 22 is configured to adjust the door 14 from an opened position, as shown in FIG. 1, to a closed position and control the angular position $\phi$ of the door 14 therebetween. The actuator 22 may be any type of actuator that is capable of transitioning the door 14 about the hinge assembly 18, including, but not limited to, electric motors, servo motors, electric solenoids, pneumatic cylinders, hydraulic cylinders, etc. The actuator 22 may be connected to the door 14 by gears (e.g., pinion gears, racks, bevel gears, sector gears, etc.), levers, pulleys, or other mechanical linkages. The actuator 22 may also act as a brake by applying a force or torque to prevent the transitioning of the door 14 between the opened position and the closed position. The actuator 22 may include a friction brake to prevent the transition of the door 14 about the hinge assembly 18.

The position sensor 24 may correspond to a variety of rotational or position sensing devices. In some embodiments, the position sensor 24 may correspond to an angular position sensor configured to communicate the angular position $\phi$ of the door to the controller. The angular position $\phi$ may be utilized by the controller to control the motion of the actuator 22. The door position sensor 24 may correspond to an absolute and/or relative position sensor. Such sensors may include, but are not limited to quadrature encoders, potentiometers, accelerometers, etc. The position sensor 24 may also correspond to optical and/or magnetic rotational sensors. Other sensing devices may also be utilized for the position sensor 24 without departing from the spirit of the disclosure.

In some embodiments, the position sensor 24 may be utilized to determine if the door 14 of the vehicle 10 is ajar or in the closed position. As discussed above, the position sensor 24 may correspond to an angular position sensor configured to communicate the angular position $\phi$ of the door to the controller. In the above example of a potentiometer, position sensor 24 can output a signal to controller 70 that can vary proportionately with the angular position $\phi$ of door 14. In one example, the signal can increase in amplitude from a lower limit at an angular position $\phi$ corresponding to a closed position of door 14 (e.g. about 0°) to an upper limit at an angular position $\phi$ corresponding to a fully-open position of door 14. The controller 70 can, accordingly, compare the signal received from position sensor 24, at any given instant, to a known range of signal amplitude and corresponding angular position to determine the particular instantaneous angular position of door 14. Further, the total range of angular positions $\phi$ of door 14 can be classified according to an open (or ajar) range and a closed range.

The closed range may be relatively small compared to the open range, but however, may be greater than a single value of angular position so as to account for slight variations of the fit of door 14 within opening 20. These variations may include changes in the compressibility of seals 48, 50 or the like. Either by slight changes in other materials over time due to temperature fluctuations or the presence of small objects or contaminants that may exert slight outward pressure on door 14 without interfering with the ability of door 14 to fully close (such as by latching or the like). In an example the closed position may correspond to an angular position $\phi$ of between 0° and 1°, between 0° and 0.5° or less, or between −0.5° and 0.5°, with other ranges being possible. Similarly, the open or ajar range may correspond to the remaining angular positions $\phi$ of door 14, which in an example, may be between 1° and 80° or the like, depending on the designated upper limit of the closed position and the total range of motion of door 14.

In this manner, controller 70 can take as an input the signal output by position sensor 24 and determine, not only the angular position $\phi$ of door 14 (which may be used to achieve desired door positioning in a feedback loop controlling actuator 22), but also whether door 14 is open or closed. The determination of the condition of door 14 between the open and closed positions may be used outside of the control scheme of actuator 22. For example, by whether the door 14 is oriented in the closed position as controlled by the actuator 22, the controller may be operable to identify a door closed status of the door 14 prior to operation of the vehicle 10. The position sensor 24 may be utilized in addition to various switches and sensors to communicate to the controller that the door 14 is secure and oriented in the closed position. The position sensor 24 may communicate that the door 14 is located in a position corresponding to the latched position thereof, or otherwise oriented proximate the body 16. In one example, a traditional closure switch or a door proximity sensor can also be included as a backup or redundancy to such utilization of position sensor 24. Further, the utilization of such a traditional closure switch or, in an example, a switch or other indicator within latch 58, can be used to implement an adjustment or re-zeroing process by which, controller 70, upon determining by position sensor 24 is within the range of angular positions $\phi$ corresponding to the closed position of door 14 (or within a predetermined tolerance thereof, e.g. about 1% to about 5%) and the sensor within latch 58 confirms that the door is completely closed and latched in such closed position, controller 70 can set the current angular position $\phi$ of door 14, as indicated by position sensor 24 as the fully closed, or zero, position. This functionality can allow controller 70 to compensate for movement among the various parts hinge assembly 18, actuator 22, position sensor 24, and associated portions of door 14 that may occur over time, due to fluctuations in temperature, and the like.

The implementation of a re-zeroing scheme can also allow a brushless DC motor to be used for actuator 22, with the control thereof useable by controller 70 to determine the angular position $\phi$ of door 14 as a form of integrated position sensor 24. In this respect, controller 70 can be in communication with the control circuitry of the brushless DC motor to track the number of revolutions thereof during an opening and closing operation of door 14. However, as inaccuracies of such tracking stack up as the motor revolves, which happens several times during a single opening and closing operation, the re-zeroing functionality can allow such a system to maintain an acceptable level of accuracy.

The position sensor 24 may also be utilized to provide feedback to the controller 70 to assist in positioning the door 14 to detect obstructions. In particular, controller 70, when directing actuator 22 to move door 14 to either the open position or the closed position (or a particular angular position $\phi$ therebetween), can use position sensor 24 to determine if door 14 is actually moving, such as by comparing the indicated angular position $\phi$ at successive intervals. If door 14 remains in a particular angular position $\phi$ for a predetermined period of time (in an example for about 0.5 seconds or in another example for up to about 1 second or two seconds), while controller 70 is attempting to close door 14, controller 70 can infer that door 14 is obstructed and take a desired corrective measure. In further examples, discussed below, position sensor 24 can be used to identify a status or orientation of the door 14 prior to initiating operation of the vehicle 10. In another example, controller 70 can output the determined condition of door 14, such as to a vehicle control module via a communication bus, such that the vehicle control module 280 can utilize the condition information for door 14 in, for example, presenting a door ajar warning to a user of vehicle 10. For example, such a warning can be presented graphically or by an indicator light on a human-machine interface ("HMI") 128 within cabin 46 or by presentation of an audible signal, which may be done in connection with a user attempting to start vehicle 10 with door 14 in an open condition. For further discussion of the vehicle control module and the communication bus, refer to FIG. 12.

Position sensor 24 may be incorporated into the structure of actuator 22 itself, or can otherwise be associated with both door 14 and opening 20. In one example, actuator 22 can include a first portion 54 coupled with the door 14 and a second portion 56 with the vehicle body 16 or frame defining opening 20, such portions being moveable relative to each other in a manner that corresponds to the movement of door 14. Position sensor 24 in the form of a potentiometer, for example, can include respective portions thereof coupled with each of such portions 54, 56 such that movement of the portion coupled with the door 14 can be measured relative to the second portion 56 thereof coupled with the vehicle opening 20 to, accordingly, measure the positioning between door 14 and opening 20. In a similar manner, sensor 24 may have a portion coupled directly with door 14 and another portion coupled directly with the opening 20. Still further, position sensor 24 can be in the form of an optical sensor mounted on either the door 14 or the opening 20 that can monitor a feature of the opposite structure (opening 20 or door 14), a marker, or a plurality of markers to output an appropriate signal to controller 70 for determination of angular position $\phi$. In one example, an optical sensor used for position sensor 24 can be positioned such that actuator 22 is in a field of view thereof such that the signal output thereby can correspond directly to a condition of actuator 22 or a relative position of first portion 54 thereof relative to opening 20.

The interference sensor 26 may be implemented by a variety of devices, and in some implementations may be utilized in combination with the actuator 22 and the position sensor 24 to detect and control the motion of the door 14.

The interference sensor 26 may correspond to one or more capacitive, magnetic, inductive, optical/photoelectric, laser, acoustic/sonic, radar-based, Doppler-based, thermal, and/or radiation-based proximity sensors. In some embodiments, the interference sensor 26 may correspond to an array of infrared (IR) proximity sensors configured to emit a beam of IR light and compute a distance to an object in an interference zone 32 based on characteristics of a returned, reflected, or blocked signal. The returned signal may be detected using an IR photodiode to detect reflected light emitting diode (LED) light, responding to modulated IR signals, and/or triangulation.

In some embodiments, the interference sensor 26 may be implemented as a plurality of sensors or an array of sensors configured to detect an object in the interference zone 32. Such sensors may include, but are not limited to, touch sensors, surface/housing capacitive sensors, inductive sensors, video sensors (such as a camera), light field sensors, etc. As disclosed in further detail in reference to FIGS. 2 and 3, capacitive sensors and inductive sensors may be utilized to detect obstructions in the interference zone 32 of the door 14 of the vehicle 10 to ensure that the door 14 is properly positioned by the actuator 22 from the open position to the closed position about the hinge assembly 18.

The interference sensor 26 may be configured to detect objects or obstructions in the interference zone 32 in a plurality of detection regions 34. For example, the detection regions 34 may comprise a first detection region 36, a second detection region 38, and a third detection region 40. In this configuration, the interference sensor 26 may be configured to detect the presence of an object in a particular detection region and communicate the detection to the controller such that the controller may control the actuator 22 accordingly. The detection regions 34 may provide information regarding the position of an object or obstruction to accurately respond and control the actuator 22 to change a direction or halt movement of the door 14 prior to a collision with the object. Monitoring the location of an object or obstruction relative to a radial extent 42 of the door 14 in relation to the hinge assembly 18 may significantly improve the control of the motion of the door 14 by allowing for variable sensitivities of each of the detection regions 34.

The variable sensitives of each of the detection regions 34 may be beneficial due to the relative motion and force of the door 14 as it is transitioned about the hinge assembly 18 by the actuator 22. The first detection region 36 may be the most critical because the actuator 22 of the door assist system 12 has the greatest leverage or torque closest to the hinge assembly 18. For example, a current sensor utilized to monitor the power delivered to the actuator 22 would be the least effective in detecting an obstruction very close to the hinge assembly 18. The limited effect of the current sensor may be due to the short moment arm of the first detection region 36 relative to the hinge assembly 18 when compared to the second detection region 38 and the third detection region 40. As such, the interference sensor 26 may have an increased sensitivity in the first detection region 36 relative to the second and third regions 38 and 40 to ensure that objects are accurately detected, particularly in the first detection region 36. In this way, the system 12 may facilitate accurate and controlled motion and ensure the greatest accuracy in the detection of objects while limiting false detections.

Though depicted in FIG. 1 as being configured to monitor a lower portion of the door 14 proximate a door sill 44, the interference sensor 26 may be configured to monitor an access region and a door opening 20 proximate a perimeter door seal 48 and/or a perimeter door opening seal 50. For example, the interference sensor 26 may correspond to a sensor or sensor array configured to monitor each of the interference zones 36, 38, and 40 for an object that may obstruct the motion of the door 14 by the actuator 22. The interference sensor 26 may be configured to monitor an entry region 52 of the vehicle 10 corresponding to a volumetric space formed between the door 14 and the body 16. A sensory region of the interference sensor may particularly focus on interface surfaces proximate the perimeter door seal 48 and the perimeter door opening seal 50.

As discussed further herein, the interference sensor 26 may be implemented by a variety of systems operable to detect objects and/or obstructions in the interference zone 32, entry region 52, and/or any region proximate the door 14 throughout the operation of the door assist system 12. Though the door assist system 12 is demonstrated in FIG. 1 having the detection regions 34 configured to detect an object located in an inner swing path between the door 14 and the body 16 of the vehicle 10, the system 12 may also be configured to detect an object or obstruction in an outer swing path of the door 14. Further details regarding such embodiments are discussed in reference to FIG. 4.

Figure 2:
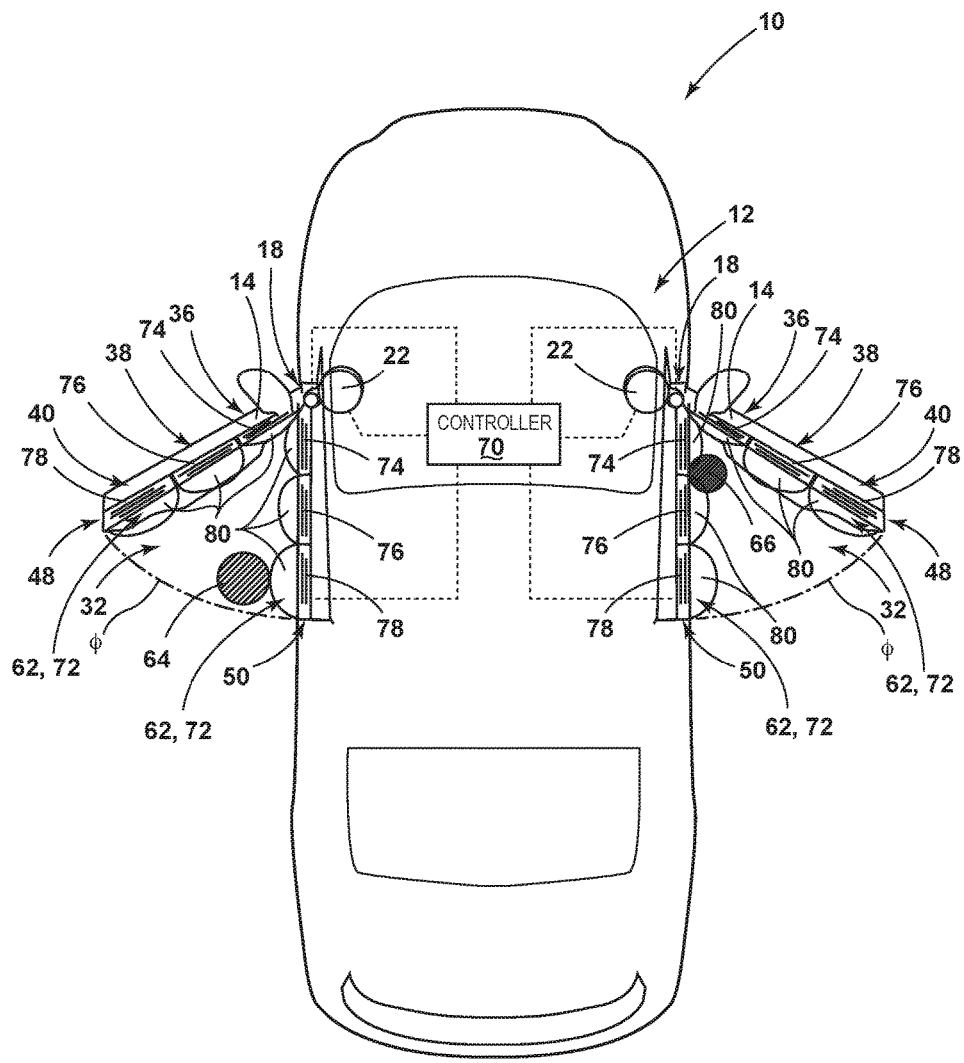
FIG. 2 is a top schematic view of a vehicle comprising a door assist system demonstrating an interference zone of a vehicle door.

Referring to FIGS. 1 and 2, an exemplary embodiment of an interference sensor 62 is shown. The interference sensor 62 may correspond to the interference sensor 26 introduced in FIG. 1. The interference sensor 62 may be disposed proximate at least one of the perimeter door seals 48 and the perimeter door opening seal 50. In some embodiments, the interference sensor 62 may correspond to one or more proximity sensors or capacitive sensors configured to detect an object. As shown in FIG. 2, the object may correspond to a first object 64 and/or a second object 66 in the entry region 52 proximate the door 14 and/or the body 16. The one or more capacitive sensors may be configured to detect objects that are conductive or having dielectric properties different from air. In this configuration, the interference sensor 62 is configured to communicate the presence of any such objects to the controller 70 such that the controller 70 can limit motion of the actuator 22 to prevent a collision between the door 14 and the objects 64 and 66.

The interference sensor 62 may correspond to a plurality of proximity sensors or a sensor array 72 comprising a first proximity sensor 74 configured to monitor the first detection region 36, a second proximity sensor 76 configured to monitor the second detection region 38, and a third proximity sensor 78 configured to monitor the third detection region 40. The sensor array 72 may be in communication with the controller 70 such that each of the proximity sensors 74, 76, and 78 is operable to independently communicate a presence of the objects 64 and 66 in an electric field 80 defining each of their respective sensory regions. In this configuration, the controller 70 may be configured to identify objects in each of the detection regions 36, 38, and 40 at different sensitivities or thresholds. Additionally, each of the proximity sensors 74, 76, and 78 may be controlled by the controller 70 to have a particular sensory region corresponding to a proximity of a particular proximity sensor to the hinge assembly 18 and/or an angular position $\phi$ of the door 14.

The controller 70 may further be configured to identify a location of at least one of the objects 64 and 66 in relation to a radial position of the objects 64 and/or 66 along a length of the door 14 extending from the hinge assembly 18. The location(s) of the object(s) 64 and/or 66 may be identified by the controller 70 based on a signal received from one or more of the proximity sensors 74, 76, and 78. In this way, the controller 70 is configured to identify the location(s) of the object(s) 64 and/or 66 based on a position of the proximity sensors 74, 76, and 78 on the door 14. In some embodiments, the controller 70 may further identify the location(s) of the object(s) 64 and/or 66 based on the signal received from one or more of the proximity sensors 74, 76, and 78 in combination with an angular position $\phi$ of the door 14.

In some embodiments, the controller 70 may be configured to identify an object in each of the detection regions 36, 38, and 40 at a different sensitivity. The controller 70 may be configured to detect an object in the first detection region 36 proximate the first proximity sensor 74 at a first sensitivity. The controller 70 may be configured to detect an object in the second detection region 38 proximate the second proximity sensor 76 at a second sensitivity. The controller 70 may also be configured to detect an object in the third detection region 40 proximate the third proximity sensor 78 at a third sensitivity. Each of the sensitivities discussed herein may be configured to detect the objects 64 and 66 at a particular predetermined threshold corresponding to signal characteristics and/or magnitudes communicated from each of the proximity sensors 74, 76, and 78 to the controller 70.

The first proximity sensor 74 may have a lower detection threshold than the second proximity sensor 76. The second proximity sensor 76 may have a lower threshold than the third proximity sensor 78. The lower threshold may correspond to a higher or increased sensitivity in the detection of the objects 64 and 66. In this configuration, the proximity sensors 74, 76, and 78 may be configured to independently detect objects throughout the interference zone 32 as the position of the door 14 is adjusted by the actuator 22 about the hinge assembly 18.

Each of the proximity sensors 74, 76, and 78 may also be configured to have different sensory ranges corresponding of their respective detection regions 36, 38, and 40. The sensory regions of each of the proximity sensors 74, 76, and 78 may be regulated and adjusted by the controller 70 such that the electric field 80 defining each of their respective sensory regions may vary. The controller 70 may adjust a range of a sensory region or an electric field 80 of the proximity sensors 74, 76, and 78 by adjusting a voltage magnitude supplied to each of the proximity sensors 74, 76, and 78. Additionally, each of the proximity sensors 74, 76, and 78 may be configured independently having different designs, for example different sizes and proportions of dielectric plates to control a range of the electric field 80 produced by a particular sensor. As described herein, the disclosure provides for a highly configurable system that may be utilized to detect a variety of objects in the interference zone 32.

The interference sensor 62 may also be implemented by utilizing one or more resistive sensors. In some embodiments, the interference sensor 62 may correspond to an array of capacitive sensors and resistive sensors in combination configured to monitor the interference zone 32 for objects that may obstruct the operation of the door 14. In yet another exemplary embodiment, the interference sensor 62 may be implemented in combination with at least one inductive sensor as discussed in reference to FIG. 3. As such, the disclosure provides for an interference sensor that may be implemented utilizing a variety of sensory techniques and combinations thereof to ensure that objects are accurately detected in the interference zone 32.

Still referring to FIGS. 1 and 2, in some embodiments, the interference sensor 62 may be incorporated as an integral component of at least one of the perimeter door seal 48 and the perimeter door opening seal 50. For example, the interference sensor 62 may correspond to a plurality of proximity sensors or an array of proximity sensors incorporated as an integral layer of at least one of the perimeter door seal 48 and the perimeter door opening seal 50. This particular embodiment of the interference sensor 62 may comprise a similar structure to the sensor array 72, discussed in reference to FIG. 6. In such embodiments, the interference sensor 62 may be implemented as a capacitive sensor array configured to detect objects proximate at least one of the perimeter door seal 48 and the perimeter door opening seal 50.

The perimeter door seal 48 and/or the perimeter door opening seal 50 may comprise an outer layer having the proximity sensors 74, 76, and 78 of the sensor array 72 proximate thereto or in connection therewith. The outer layer may correspond to a flexible or significantly rigid polymeric material having the interference sensor 62 connected thereto. In some embodiments, the sensor array 72 may also be disposed proximate the perimeter door seal 48 and/or the perimeter door opening seal 50 on the door 14 and/or the body 16 respectively. In this configuration, the plurality of proximity sensors of the sensor array 72 may be utilized to detect an object in any of the detection regions 36, 38, and 40. This configuration may further provide for the interference sensor 62 to be conveniently incorporated into the perimeter door seal 48 and/or the perimeter door opening seal 50 for ease of implementation of the door assist system 12.

Figure 3:
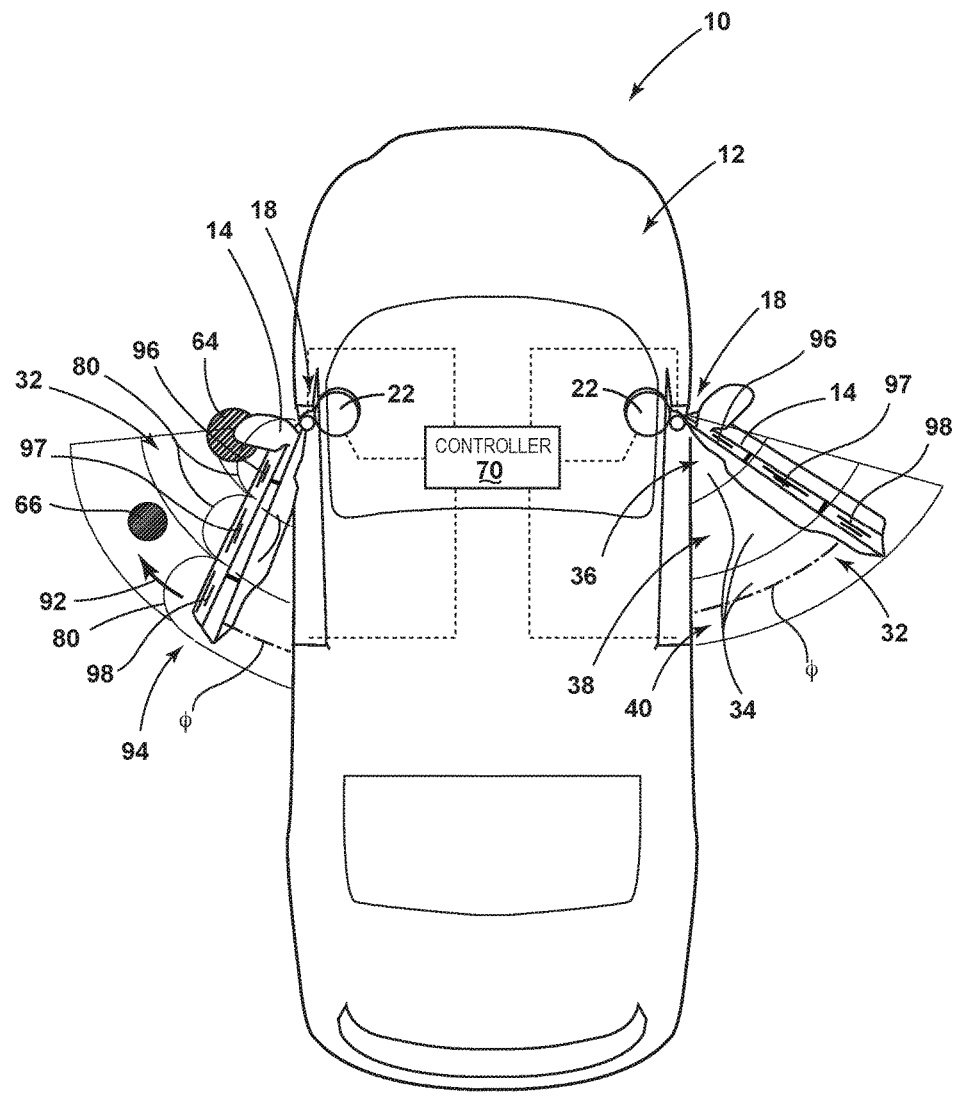
FIG. 3 is a top schematic view of a vehicle comprising a door assist system configured to detect an object or obstruction in an outer swing path of the door.

Referring to FIG. 3, a top schematic view of the vehicle 10 comprising the door assist system 12 is shown. As discussed previously, the door assist system 12 may further be configured to detect the objects 64 and 66 in an outer swing path 92 of the door 14. In this configuration, the controller 70 may be configured to control the actuator 22 to adjust the angular position $\phi$ of the door 14 of the vehicle 10 from a closed position to an opened position. As discussed previously, the interference sensor 26 may correspond to a sensor array 94 comprising a plurality of proximity sensors. Each of the proximity sensors may be configured to detect the objects 64 and 66 in the outer swing path 92 of the door 14. The plurality of proximity sensors of the sensor array 94 correspond to a first proximity sensor 96, a second proximity sensor 97, and a third proximity sensor 98. In this configuration, the controller 70 may be configured to detect the objects 64 and 66 in the plurality of detection regions 34 of the interference zone 32 corresponding to the outer swing path 92 of the door as well as the inner swing path as discussed in reference to FIG. 1.

The interference sensor 26 may be configured to identify a location of each of the objects 64 and 66 based on the position of the objects 64 and 66 relative to each of the detection regions 34 and the angular position $\phi$ of the door 14. That is, the controller 70 may be configured to identify and monitor the location of the objects 64 and 66 relative to the radial extent 42 of the door 14 in relation to the hinge assembly 18. The controller 70 may identify and monitor the location of the objects based on a detection signal for each of the objects received from one or more of the proximity sensors 96, 97, and 98. Based on the detection signal from one or more of the proximity sensors 96, 97, and 98, the controller 70 may identify the location of the objects based on the position of each of the proximity sensors 96, 97, and 98 along the radial extent 42 of the door 14. The controller 70 may further identify the location of the objects based on the angular position $\phi$ communicated from the door position sensor 24. In this configuration, the door assist system 12 may be configured to position the door 14 from a closed position to an opened position while preventing the door 14 from striking the objects 64 and 66.

In some embodiments, the controller 70 may further be operable to prioritize a first detection of the first object 64 and a second detection of the second object 66. For example as illustrated in FIG. 3, the controller 70 may identify that the door 14 is closer to the first object 64 than the second object 66 in relation to the rotational path of the door 14 about the hinge assembly 18. The controller 70 may identify that the first object 64 is closer than the second object based on a proximity of each of the objects 64 and 66 to the door 14 as determined via one or more signals received by the controller 70 from the interference sensor 26. The controller 70 may monitor the proximity of each of the objects 64 and 66 throughout an adjustment of the angular position $\phi$ of the door 14 based on the one or more signals. Once the controller 70 detects that a proximity signal from at least one of the proximity sensors 96, 97, and 98 exceeds a predetermined threshold, the controller 70 may control the actuator 22 to halt a positioning adjustment of the door 14. In this way, the controller 70 may prioritize a control instruction to control the actuator 22 to limit the angular position $\phi$ of the door 14 to prevent a collision between the door 14 and one or more objects 64 and 66 in the interference zone 32.

Figure 4:
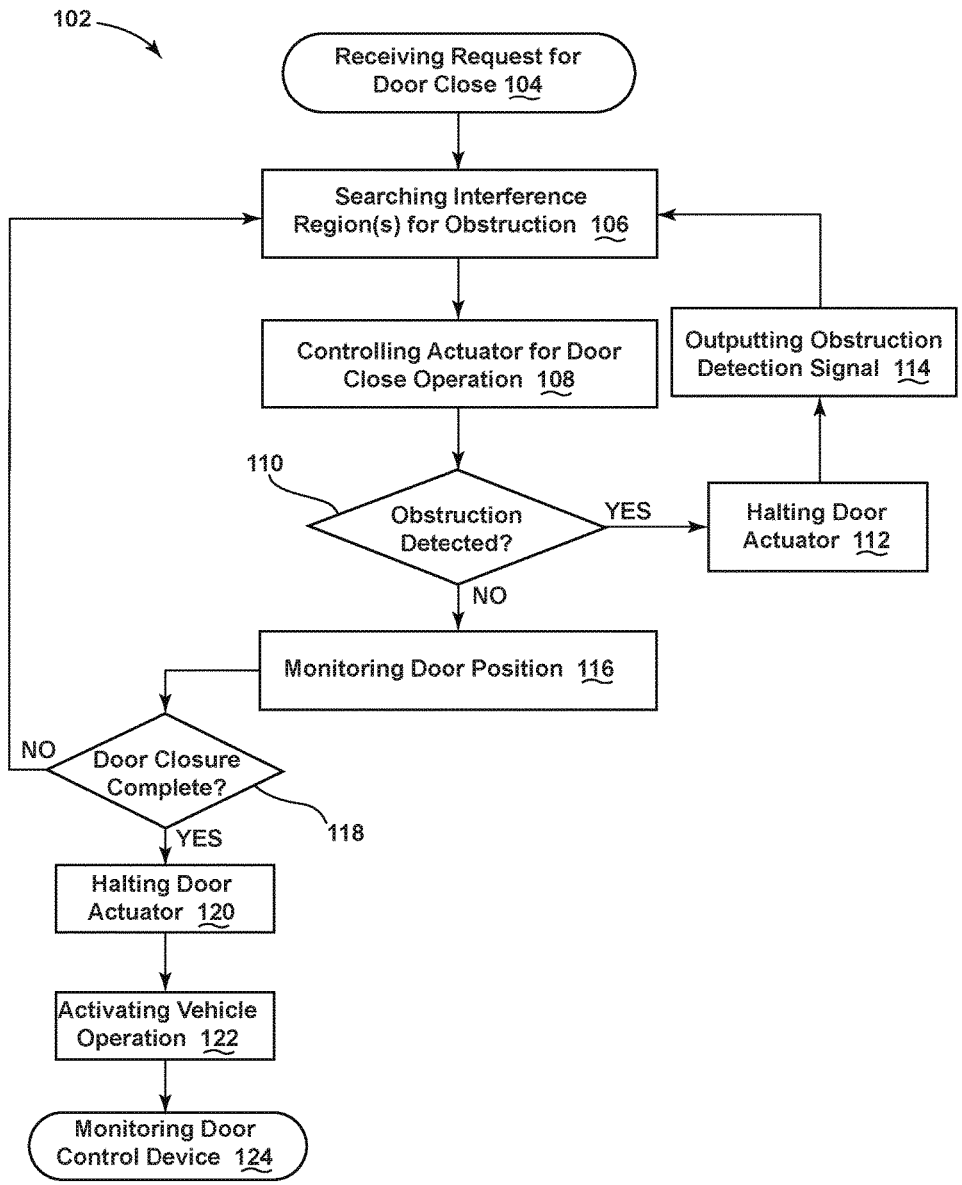
FIG. 4 is a flow chart of a method for controlling a door assist system.

Referring now to FIG. 4, a flow chart of a method 102 for controlling the door assist system 12 is shown. The method 102 may begin in response to the controller 70 receiving an input signal from a door control device requesting that the door 14 be positioned in the closed position (104). In response to receiving the input signal, the controller 70 may activate the interference sensor 26 to identify whether an object or obstruction is located in the interference zone 32 or the interference regions, as discussed in reference to FIGS. 1, 2, and 3 (106). Additionally, in response to receiving the input signal, the controller 70 may activate the actuator 22 to begin positioning the door 14 in a door close operation (108). Additional information regarding the door control device is discussed in reference to FIG. 5.

As the actuator 22 begins to position the door 14, the controller 70 is configured to identify if an obstruction is detected (110). If an obstruction is detected, the controller 70 may halt the closing operation of the door (112). The controller 70 may also output an obstruction detection signal, which may be configured to activate an alarm or warning to alert an operator or occupant of the vehicle 10 of the obstruction detection (114). If an obstruction is not detected, the controller 70 may continue positioning the door 14 with the actuator 22 and monitoring the angular position $\phi$ of the door 14 by processing position information from the position sensor 24 (116). As the door 14 is repositioned, the controller 70 may continue to monitor the position information to determine when the door closure operation is complete (118). Additionally, the controller 70 may continue to monitor the interference zone 32 for obstructions throughout the repositioning of the door 14 as discussed in reference to method steps 106-114.

In step 118, if the door closure operation is determined to be complete, the controller 70 may halt the door actuator 22 (120). Additionally, the controller 70 may output a control signal that may identify that the door 14 of the vehicle 10 is secure such that a vehicle operation may be activated (122). A vehicle operation may include releasing a parking brake, engaging an autonomous vehicle operation, or otherwise enabling an operation of the vehicle 10 that may be completed when the door 14 is located in the closed position. More particularly, controller 70 may communicate with vehicle control module 280, by transmission of a signal or the like, to cause vehicle control module 280 to take a predetermined action in response to controller 70 having determined that door 14 is ajar. As discussed above, such a determination can be made using position sensor 24 to determine if the angular position ϕ of door 14 is within the designated range for the closed position thereof. The action taken by vehicle control module 280 can include maintaining the vehicle 10 in a stopped condition, such as by preventing ignition of the engine of vehicle 10 (such as by communication with an ignition module or unit of vehicle 10), implementing a park-lock mode, whereby the vehicle transmission is maintained in a park mode or condition, or the like (e.g. by communication with a park-lock module associated with the transmission). Vehicle 10 may provide an override for such park-lock functionality, such as via a menu item on HMI 128 or another accessible control within vehicle. Further, in an embodiment where vehicle 10 is configured for autonomous operation (including fully autonomous operation), vehicle control module 280 may prevent vehicle 10 from moving from a current location under autonomous operation.

Autonomous operation of vehicle 10 may be achieved, for example, by including within vehicle 10 an autonomous operation system 158 (which may be included within the functionality of vehicle control module 280, for example) having a vehicle location module 290 (FIG. 11) that may include various devices or features for identifying a location and trajectory of vehicle 10, such as a global positioning service ("GPS") module or the like. Autonomous operation system 158 may also include a vision module 298 that can identify items surrounding vehicle 10, such as pedestrians, other cars, etc., as well as the roadway on which vehicle 10 is traveling, including lane markers, shoulders, curbs, intersections, crosswalks, traffic lights, etc. Vision module 298 may include a video camera, a light field camera (e.g. a plenoptic camera), RADAR, LIDAR, and various combinations thereof. Memory (either within vehicle control module 280, controller 70 (i.e. memory 288), or within autonomous operation system 158 itself, may also include map data for at least an area surrounding vehicle 10. An internet or other wireless data connection may also be provided for updating, maintaining, and acquiring such data, including when traveling into new areas.

Autonomous operation system 158 is configured to process the position, trajectory, roadway, and map data to determine a path of travel for vehicle 10 between a current location and a desired destination. Further, autonomous operation system 158 is also configured to control the movement of vehicle 10 along such a path, including by control of a vehicle steering module 292, a vehicle brake module 294, and the vehicle throttle 296. Such control is implemented to maintain the speed of vehicle 10 at an acceptable level, while avoiding other vehicles, objects, etc. and while obeying surrounding traffic signs and signals. In this manner, a vehicle may be made "fully autonomous," whereby vehicle 10 may drive from a current location to a destination without supervision by a user, driver, or the like. In some embodiments, fully autonomous vehicles may operate under the direction of a user that is not present within the vehicle 10, including by incorporation of a communication module capable of communicating with an application running on a remote device, such as a computer, smartphone, tablet, dedicated device, or the like. In this and in other embodiments, it may be useful for such a vehicle 10 to be able to identify whether or not door 14 (and similarly, other doors of vehicle 10) is closed, before beginning movement along the determined vehicle path. Accordingly, controller 70 can output a signal to one of vehicle control module 280 or autonomous operation system 158 to prevent autonomous driving of vehicle 10 if one or more doors 14 (e.g. any of the four doors of a sedan) is determined to be in an open, ajar, or non-closed condition. Such information can also be transmitted to the remote device, along with other vehicle condition information. In a further embodiment, controller 70 can take action to remedy the door open condition by alerting an occupant of vehicle 10 (such as by visible or audible indication) or by moving door 14 into the closed configuration, such as by control of actuator 22 and monitored by interference sensor 26, as discussed above.

After the door close operation is complete, the controller 70 may continue to monitor the door control device to determine if a door opening operation is requested (124). As described herein, the method 102 for controlling the door assist system 12 may further be utilized to control the opening operation of the door 14 and may include additional interference sensors 26 configured to detect obstructions that may be encountered as the actuator 22 opens the door 14.

Figure 5:
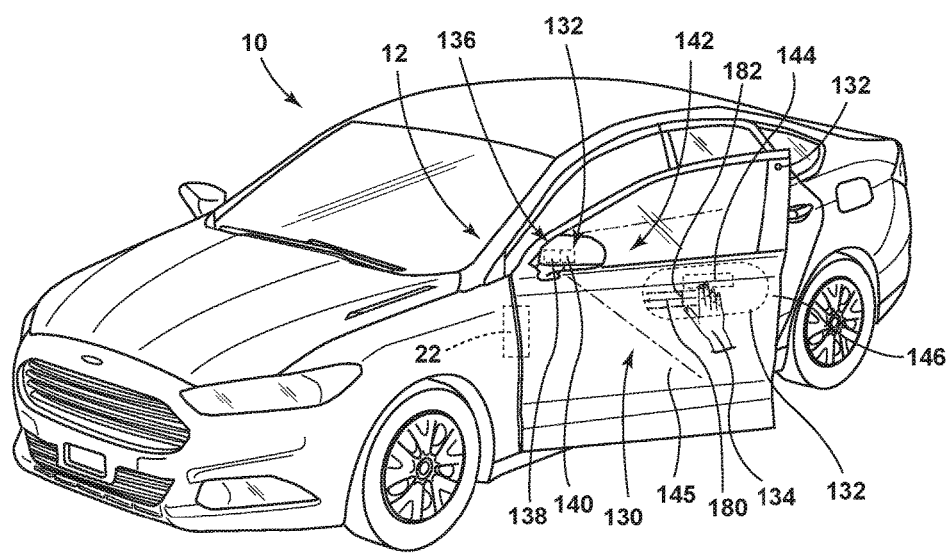
FIG. 5 is a projected view of a vehicle demonstrating a door control device for operating a door assist system.

Referring now to FIG. 5, a projected view of the vehicle 10 is shown demonstrating the door control device 130 of the door assist system 12. The door control device 130 may correspond to a gesture sensor 132 configured to detect a motion or gesture by a tracked object 134, such as a limb, hand, foot, head, etc. of a user or other person positioned on the exterior of vehicle 10. The door control device 130 may correspond to a variety of sensory devices. Sensory devices that may be utilized for the gesture sensor 132 may include, but are not limited to optical, capacitive, resistive, infrared, and surface acoustic wave technologies, as well as other proximity and sensor arrays or other elements for determining the gestures of the object 134 in proximity thereto. Various interference sensors as described herein may also be utilized to identify gestures of the object 134.

As discussed herein, the gesture sensor 132 may be utilized to detect and record a motion of the object 134 and communicate motion data corresponding to the motion recorded by the gesture sensor 132 to the controller 70. In some embodiments, the gesture sensor 132 may correspond to an optical detection device 136. The optical detection device 136 may comprise an image sensor 138 and a light emitting device 140 in communication with the controller 70. The light emitting device 140 may correspond to a variety of light emitting devices and in some embodiments, may correspond to one or more light emitting diodes (LEDs) configured to emit light outside the visible range (e.g. infrared or ultraviolet light). The image sensor 138 may be configured to receive a light beam or a reflection thereof from the light emitting device 140 in a field of view 142 of the image sensor 138. The image sensor 138 may be a CMOS image sensor, a CCD image sensor, or any form of image sensor operable detect light emitted by the light emitting device 140.

Figure 6:
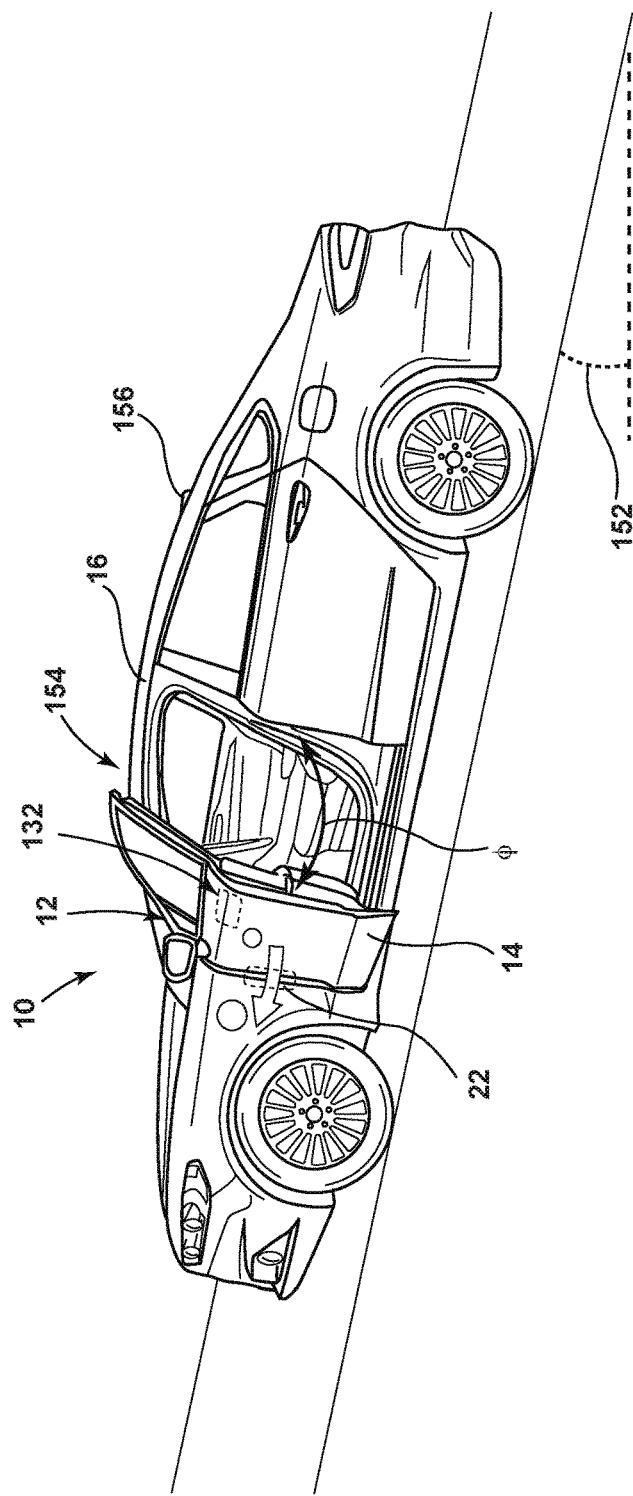
FIG. 6 is a side environmental view of a vehicle comprising a door assist system configured to maintain an angular position of the door.

In some embodiments, the gesture sensor 132 may correspond to one or more proximity sensors. The one or more proximity sensors may correspond to a sensor array 144 disposed on a panel 145 of the vehicle 10. As illustrated in FIG. 6, the sensor array 144 is disposed proximate an outer surface 146 of the door 14. The sensor array 144 may be configured to detect the object 134 within a proximity or sensory range corresponding to a detection field of the sensor array 144. Once the object 134 is detected, the sensor array 144 may communicate a signal to the controller 70 corresponding directly to a motion of the object relative to a plurality of regions of the sensor array 144. In this way, the sensor array 144 is operable to communicate the movement of the object 134 proximate the sensor array 144 such that the controller 70 can utilize the signal to identify a gesture by the object 134 and activate the door assist system 12.

Referring now to FIG. 6, a side environmental view of the vehicle 10 is shown. In some embodiments, the controller 70 may further be operable to detect circumstances or characteristics of a location of the vehicle 10 that may cause the door 14 to swing open or close unintentionally. Such circumstances may correspond to gusts of wind and/or the vehicle 10 being parked on an incline 152. In such circumstances, the controller 70 may be operable to detect the unintentional movement of the door 14 and utilize the door assist system 12 to significantly prevent the unintentional motion. In this way, the disclosure provides for an advantageous system that may be utilized to improve the operation of the door 14 of the vehicle 10.

In some implementations, characteristics of the location of the vehicle 10 may correspond to an angular orientation of the vehicle 10 relative to gravity. The system 12 may comprise an incline sensor 154 in communication with the controller 70 configured to detect and measure the orientation. The incline sensor 154 may be disposed in various portions of the vehicle 10 and correspond to a variety of sensors. In some implementations, the incline sensor 154 may be configured to measure the incline about a plurality of axes via a tilt sensor, accelerometer, gyroscope, or any device operable to measure the incline of the vehicle 10 relative to gravity. The incline sensor 154 may communicate the incline 152 of the vehicle 10 to the controller 70 such that when the door 14 is arranged the opened position or a partially opened position, the controller 70 is configured to activate the actuator 22 to prevent the door 14 from swinging open, closing, or changing in angular position $\phi$. In some embodiments, the controller 70 may be operable to identify that the vehicle 10 is likely on an incline by utilizing a GPS and a map to determine if the vehicle 10 is located on the incline 152.

In some embodiments, the controller 70 may be configured to control the actuator 22 to balance the door 14 relative to the incline 152. Based on the angular position or orientation communicated to the controller 70 by the incline sensor 154, the controller 70 may be operable to determine a force required to apply to the door 14 to maintain the angular position $\phi$ of the door 14 and prevent the door 14 from accelerating due to gravity. The controller 70 is further operable to control the actuator 22 to apply the force to the door to simulate the motion of the door on a level surface. In this way, the controller 70 may identify that the vehicle 10 is parked or oriented at an angle and prevent the door 14 from swinging under the force of gravity.

Additionally, the controller 70 may be configured to limit a rate of motion of the door 14 by monitoring a change in the angular position $\phi$ of the door communicated by the position sensor 24. In such embodiments, the controller 70 may monitor the rate of change of the angular position $\phi$ of the door 14 and control the actuator 22 to apply an opposing force to a motion of the door 14 to dampen or slow the motion of the door 14 to a predetermined rate. The controller 70 may further be configured to hold the door 14 at one or more angular positions in response to an input received from the door control device 130 or based on one or more programmed door positions stored in a memory of the controller 70. In this way, the door assist system 12 provides for a variety of control schemes to assist in the operation of the door 14.

In some embodiments, the door assist system 12 may be configured to function in a semi-manual operation wherein a user of the door 14 may manually adjust the angular position $\phi$ and the actuator 22 may maintain the angular position $\phi$ set by the user. As shown in FIG. 6, the user may locate the door 14 at the angular position $\phi$. In response to the controller 70 receiving data from the incline sensor 154 identifying that the vehicle 10 is parked on the incline 152, the controller 70 may activate the actuator 22 to prevent the door from moving or rotating about the hinge assembly 18. The controller 70 may be configured to hold the door at the angular position $\phi$ until the user interacts with the door control device 130, for example the gesture sensor 132, or a conventional handle. The controller 70 may also be configured to hold the door at the angular position $\phi$ until the user applies force sufficient that the actuator 22, the position sensor 24, or any of a variety of devices and/or sensors discussed herein communicates to the controller 70 to release the angular position $\phi$ of the door 14.

As described, the controller 70 may control the actuator 22 to apply sufficient force to prevent motion of the door 14 about the hinge assembly 18 due to gravity. The controller 70 may also be configured to detect an external force applied to the door 14 by a user of the vehicle 10. The external force may be identified by the controller 70 as a spike or increase in current from the actuator 22. Upon identification of the spike or increase, the controller 70 may gradually release the actuator 22 such that the angular position $\phi$ may be freely adjusted. Additionally, upon release of the actuator 22, the controller 70 may be configured to control the rate of closure or the rate of change of the angular position $\phi$. In this way, after the controller 70 releases the actuator 22 such that the door 14 may move, the actuator 22 still may maintain force on the door 14 sufficient to prevent the door 14 from swinging rapidly and/or slamming.

In some embodiments, a characteristic of a location of the vehicle 10 may correspond to a weather or wind speed condition proximate the vehicle 10. The door assist system 12 may utilize a positioning device (not shown), for example a global positioning system (GPS), to retrieve weather information or at least one weather condition based on a location or GPS location identified for the vehicle 10. The GPS location and/or weather information may be utilized to identify periods when the door 14 may likely be unexpectedly repositioned or forced to swing about the hinge assembly 18 due to a wind gust or elevated wind speeds. The weather information may be accessed by the controller 70 via a wireless data connection, for example a GSM, CDMA, WiFi, or any other wireless data communication protocol.

Figure 7:
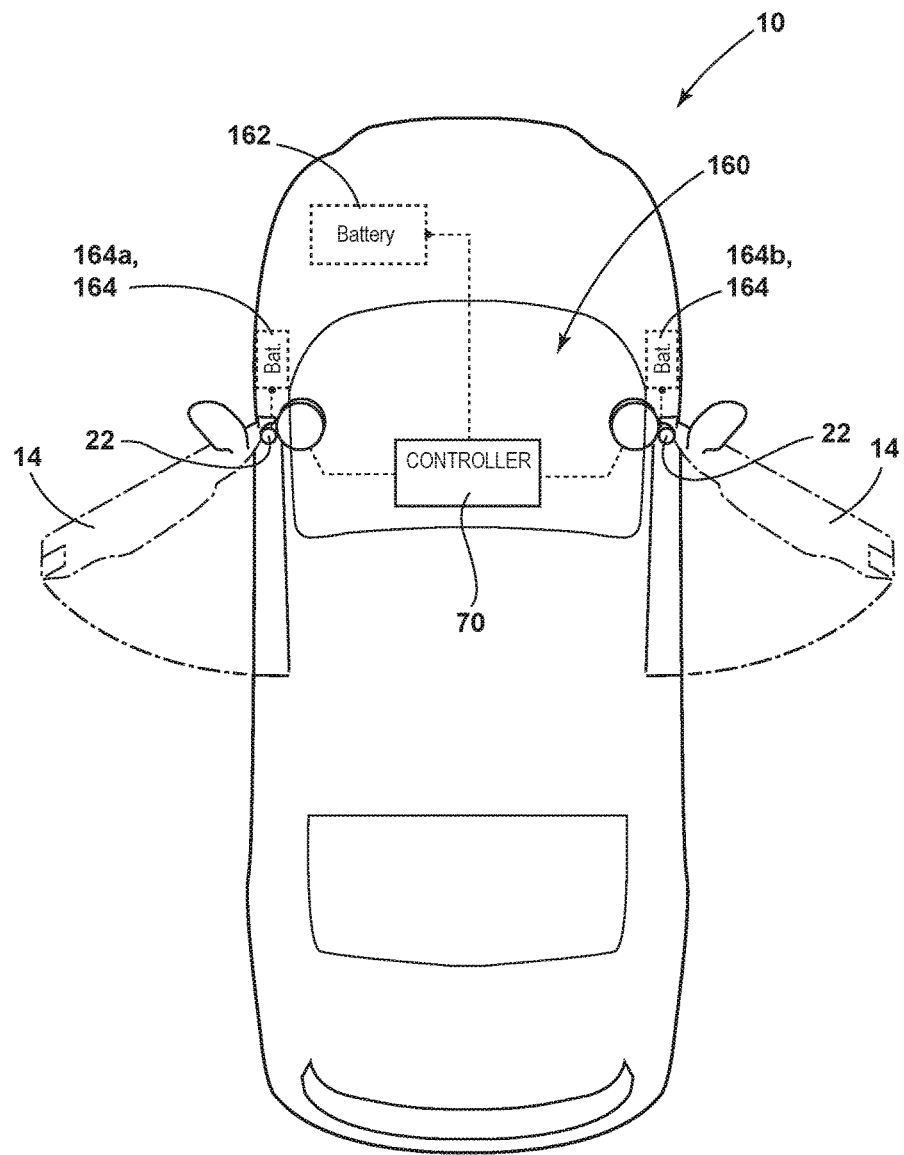
FIG. 7 is a schematic diagram of a vehicle demonstrating a power system for a door control system.

Referring now to FIG. 7, a schematic diagram of the vehicle 10 is shown demonstrating a power system 160 of the vehicle 10. The power system 160 of the vehicle 10 may incorporate a central power source 162. The control power source 162 may be conductively connected to a starter, an alternator, a generator, one or more electric motors, and/or various electrical systems of the vehicle 10. The door assist system 12 may also be in conductive connection with the central power source 162 and derive electrical power therefrom. In some embodiments, the vehicle 10 may further be equipped with one or more secondary power sources 164.

The secondary power sources 164 may be utilized in addition to the central power source 162 and may provide electrical energy to the door actuators 22. In some embodiments, each of the door actuators 22 may be configured to draw power from a dedicated secondary power source 164. In such embodiments, one or more of the secondary power sources 164 may be interconnected or may function independently. The secondary power sources 164 may be interconnected to one another and/or to the central power source 162 via the controller 70. Accordingly, each of the power sources 162 and 164 may be configured to function independently and or in various combinations to provide electrical current to the various electrical systems of the vehicle 10.

As discussed later in reference to FIG. 12, in some embodiments, the controller 70 and/or or more electrical circuits of the vehicle 10 may be configured to share electrical energy among or between the power sources (e.g. power sources 162 and 164). In this configuration, the controller 70 may be configured to identify one of the secondary power sources 164a having a charge level below a first charge threshold and connect the secondary power source 164a with at least one of the central power source 162 and the secondary power sources 164b. Additionally, the controller 70 may be configured to share electrical energy from one or more of the secondary power sources 164 to provide power to the central power source 162. Accordingly, the power system 160 may provide for various configurations of the power sources 162 and 164 that may provide for the electrical power to be selectively applied to one or more of the electrical/electro-mechanical devices discussed herein.

Figure 8:
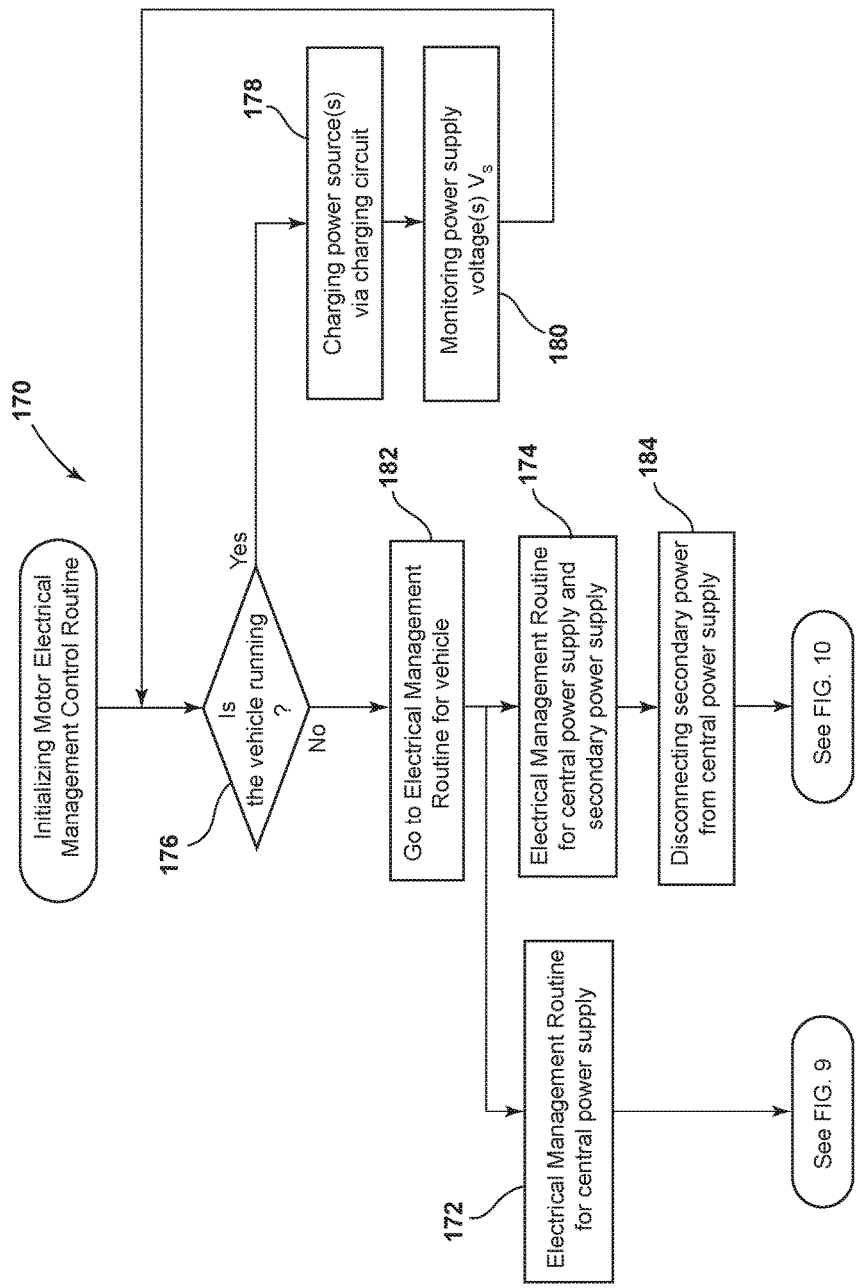
FIG. 8 is a flow chart of a method for an electrical management routine for a door control system.

Referring now to FIG. 8, a flow chart of a method 170 is shown demonstrating an electrical management routine for the power system 160. For clarity, the method 170 is shown having a first control routine 172 corresponding to a system utilizing only the central power source 162. A second control routine 174 is shown for a system utilizing the central power source 162 and at least one secondary power source 164. The subroutines 172 and 174 may be selectively applied to specific embodiments of the power system 160 and/or may be selectively applied by the controller 70 to provide for flexibility in the operation of the power system 160.

The method 170 may begin by determining if the vehicle 10 is running (176). For example, the controller 70 may be configured to manage the power available to the vehicle 10 differently in response to receiving charging and/or operational voltage from an alternator or generator that may be active when the vehicle 10 is running. If the controller 70 identifies that the vehicle 10 is running, the controller 70 may be configured to charge the central power source 162 and/or the secondary power source(s) 164 (178). For example, the current generated by the alternator may be sufficient to provide power to the electrical systems of the vehicle 10, which may include the door actuators 22. The controller 70 may also monitor the voltages of the central power source 162 and/or the secondary power source(s) 164 throughout operation of the vehicle 10 (180). Also, the controller 70 may monitor the voltages of the power sources 162 and/or 164 when the vehicle 10 is not running and/or in response to a control of a door actuator 22, etc.

If the vehicle 10 is not running, the controller 70 may initiate a particular control routine for the vehicle 10, which may depend on a desired control scheme or a particular embodiment of the central power source 162 and/or the secondary power source 164 (182). As previously discussed, each of the first control routine 172 and the second control routine 174 are discussed separately in the following paragraphs. The first control routine 172 is discussed in reference to FIG. 9. The second control routine 174 may begin by disconnecting the secondary power source(s) 164 from the central power source 162, which may prevent a discharge of the central power source 162 by the door actuators 22 (184). The second control routine 174 is further discussed in reference to FIG. 10.

The method 170 may be utilized to control the door actuator 22 in various embodiments. For example, the method 170 may be utilized with a power assist device and/or a fully automatic door system as discussed herein. Accordingly, the door actuator 22 may be operable to generate a torque or force required to move the door 14 between open and closed positions, as well as various detent positions. During operation, the door actuator 22 and/or additional electrical systems of the vehicle 10 may deplete the electrical energy stored in the central power source 162. Such a depletion of electrical energy may result in a partial or complete failure of the door actuator 22. The method 170 may provide for control of the door actuator 22 in response to the controller 70 identifying that a charge level $V_{main}$ of central power source 162 is within a plurality of ranges. Such ranges may be discussed herein corresponding to predetermined charge levels (e.g. $V_1$, $V_2$, etc.).

Figure 9:
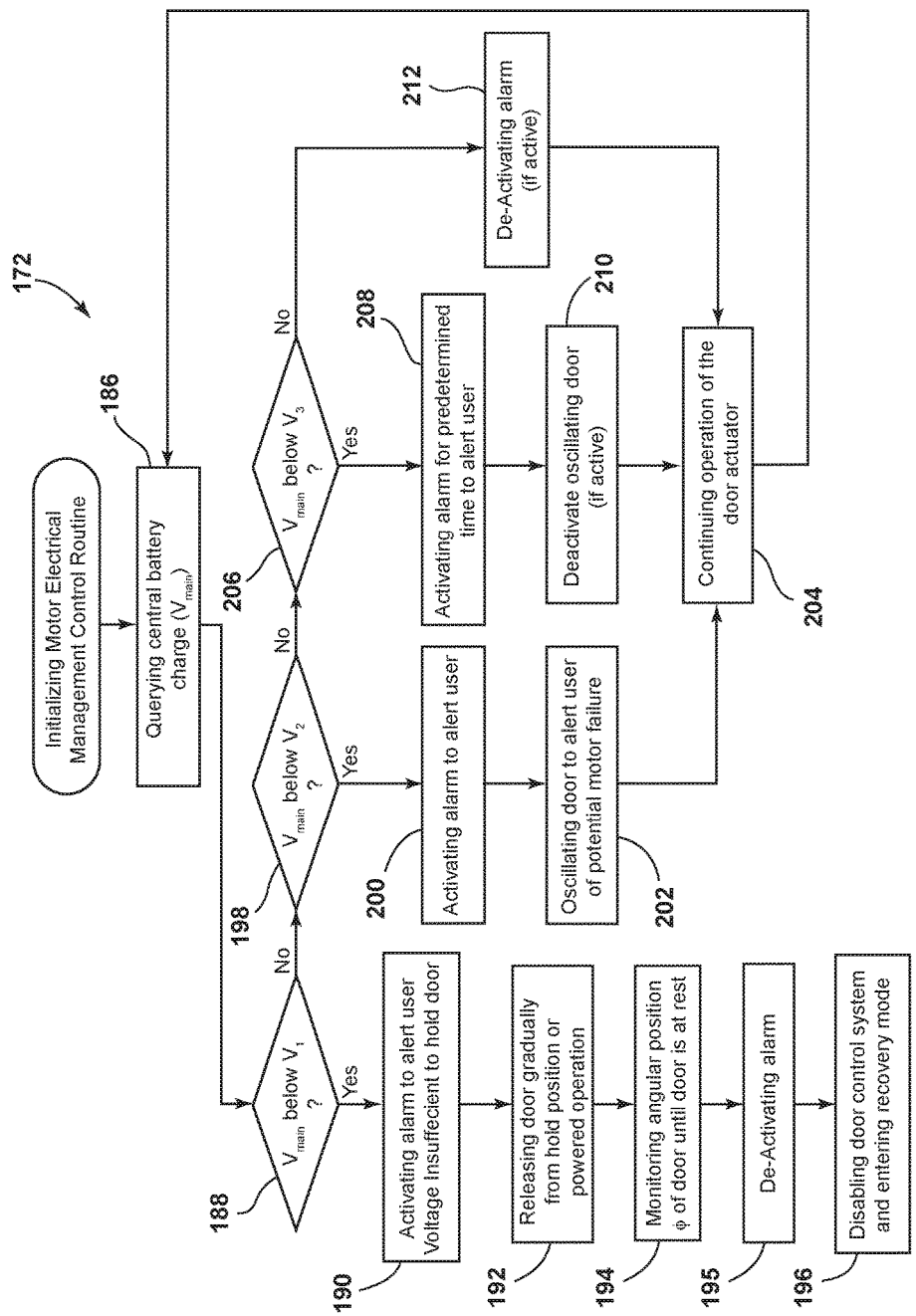
FIG. 9 is a flow chart of a control routine for a central power source for a door control system.

Referring now to FIG. 9, a flow chart of the first control routine 172 is shown. The first control routine 172 may be configured to provide for operation of at least one door actuator 22 when an engine of the vehicle 10 is inactive. In the first control routine 172, the controller 70 may monitor the charge level $V_{main}$ of central power source 162 via one or more circuits 186. The one or more circuits may be incorporated into the controller 70 and/or implemented as additional devices in communication with the controller 70. The one or more circuits may be configured to detect a voltage level and additional characteristics (e.g. current, temperature, etc.) to determine the charge level $V_{main}$ of the central power source 162. In this configuration, the controller 70 may be operable to determine a charge level of the central power source 162 to ensure that there is sufficient power to activate the door actuators 22. The controller 70 may identify the charge level $V_{main}$ of the central power source 162 to prevent an unexpected failure of the door actuator 22.

In operation, the controller 70 may compare the charge level $V_{main}$ to a plurality of predetermined voltage or charge thresholds. For example, the controller 70 may compare the charge level $V_{main}$ to a first charge threshold $V_1$ (188). The first charge threshold $V_1$ may correspond to a minimum operational level of the charge level $v_{main}$. The minimum operational level of the charge level $V_{main}$ may correspond to a voltage requirement for operation of at least one door actuator 22. In an exemplary embodiment, the minimum voltage may be approximately 8.5 V. The controller 70 may also compare the charge level $V_{main}$ to additional thresholds, which are discussed herein.

In response to the controller 70 identifying that the charge level $V_{main}$ is less than the first charge threshold $V_1$, the controller 70 may continue to activate an alarm to alert a user or passenger of the vehicle 10 of a warning condition (190). The alarm 314 is shown in FIG. 12 and may correspond to a device configured to output an audible and/or visual warning (e.g. a speaker and/or a light source). The controller 70 may further control the door actuator 22 to release the door 14 gradually from a held position (192). The held condition may correspond to any condition that the door actuator 22 applies force to adjust or hold a position the door 14.

While the controller 70 is controlling the door actuator 22 to release the door 14, the controller 70 may monitor the angular position φ of the door 14 to ensure that the door 14 does not exceed a movement threshold. The movement threshold may correspond to a threshold of an angular velocity of the door 14. The controller 70 may also monitor the angular position φ of the door 14 to identify when the door 14 is at rest (194). In response to the door 14 being at rest, the controller may deactivate the alarm to notify the user or passenger of the vehicle 10 that the warning condition has passed (195). Additionally, the controller 70 may enter a recovery routine (196). The recovery routine may provide instructions (e.g. via the HMI 128) to the user or passenger of the vehicle 10 of instructions to recover from a low battery or low charge condition (e.g. charge the power source 162 and/or start the vehicle 10) or contact a service professional.

The method 170 may compare the charge level $V_{main}$ of the central power source 162 to various charge thresholds to determine a warning state for the door actuator 22. For example, the controller 70 may compare the charge level $V_{main}$ to a second charge threshold $V_2$ (198). The second charge threshold $V_2$ may be within a predetermined value of the minimum operational level of the charge level $V_{main}$. In an exemplary embodiment, second charge threshold $V_2$ may be approximately 10 V. In response to the controller 70 identifying that the charge level $V_{main}$ is less than the second charge threshold $V_2$, the controller 70 may activate the alarm to alert a user or passenger of the vehicle 10 of the warning condition (200). The controller 70 may further control the door actuator 22 to change the position of the door 14 periodically or oscillate the door 14 to generate a visual warning (202).

Once the oscillation of the door 14 is activated, the controller may continue to control the door actuator 22 to control the position the door 14 until a positioning process or hold process is completed (204). Additionally, the controller 70 may return to step 186 to query the charge level $V_{main}$ of the central power source 162. Based on the charge level $V_{main}$ of the central power source 162, the controller 70 may continue to identify a control state as discussed herein.

The controller 70 may also compare the charge level $V_{main}$ to a third charge threshold $V_3$ (206). The third charge threshold $V_3$ may be within a predetermined value of the minimum operational level of the charge level $V_{main}$. In an exemplary embodiment, third charge threshold $V_3$ may be approximately 11 V. In response to the controller 70 identifying that the charge level $V_{main}$ is below the third charge threshold $V_3$, the controller 70 may activate the alarm to alert a user or passenger of the vehicle 10 of the warning condition (208). The controller 70 may then deactivate the oscillating motion of the door 14, if applicable (210). Additionally, the controller 70 may continue to step 204 to control the door actuator 22 until a positioning process or hold process is completed.

In step 206, the controller 70 may further identify that the charge level $V_{main}$ is greater than the third charge threshold $V_3$. In response to the controller 70 identifying that the charge level $V_{main}$ is greater than the third charge threshold $V_3$, the controller 70 may de-activate the alarm (212). The controller 70 may then proceed to step 204 to output instructions to the door actuator 22 to control the position the door 14 until a positioning process or hold process is completed.

As discussed herein, the method 170 may provide for a flexible control scheme that may include one or more comparisons to the plurality of charge levels or thresholds of the charge level $V_{main}$. In response to the controller 70 comparing the charge level $V_{main}$ to each of the plurality of charge thresholds, the controller 70 may activate various warnings and/or control states to communicate a status of the door actuator 22. By providing for the warnings and/or control states, the controller 70 may provide for effective operation of the door actuator 22 in various embodiments.

Figure 10:
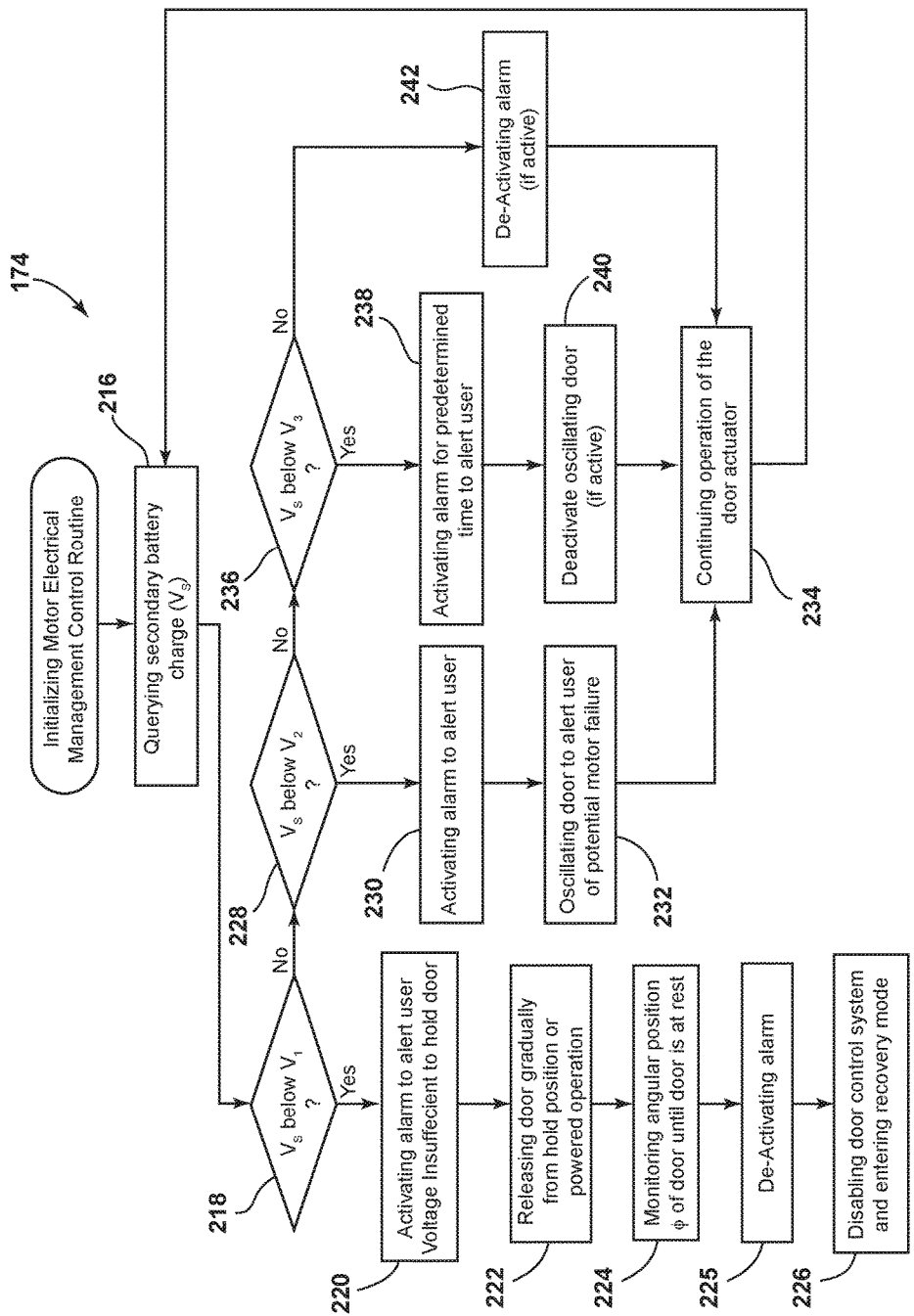
FIG. 10 is a flow chart of a control routine for a secondary power source for a door control system.

Referring now to FIG. 10, a flow chart of the second control routine 174 is shown. As discussed herein, the control routine 174 may provide for operation of at least one door actuator 22 in response to the secondary power source 164 being depleted. Under such conditions, a partial or complete failure of the door actuator 22 may result. The method 170 may provide for control of the door actuator 22 in response to the controller 70 identifying that a charge level $V_S$ of secondary power source 164 is within a plurality of ranges. Such ranges may be discussed herein corresponding to predetermined charge levels (e.g. $V_1$, $V_2$, etc.).

In the second control routine 174, the controller 70 may monitor the charge level $V_S$ of secondary power source 164 via one or more circuits that may be incorporated into the controller 70 and/or implemented as additional devices in communication with the controller 70 (216). The one or more circuits may be configured to detect a voltage level and additional characteristics (e.g. current, temperature, etc.) to determine the charge level $V_S$ of the secondary power source 164. In this configuration, the controller 70 may be operable to determine a charge level of the secondary power source 164 to ensure that there is sufficient power to activate and control one or more of the door actuators 22. In this way, the controller 70 may identify the charge level $V_S$ of the secondary power source 164 to prevent an unexpected failure of the door actuator 22.

In operation, the controller 70 may compare the charge level $V_S$ to a plurality of predetermined voltage or charge thresholds. For example, the controller 70 may compare the charge level $V_S$ to a first charge threshold $V_1$ (218). The first charge threshold $V_1$ may correspond to a minimum operational level of the charge level $V_S$. The minimum operational level of the charge level $V_S$ may correspond to a voltage requirement for operation of at least one door actuator 22. In an exemplary embodiment, the minimum voltage may be approximately 8.5 V. The controller 70 may also compare the charge level $V_S$ to additional thresholds, which are discussed herein.

In response to the controller 70 identifying that the charge level $V_S$ is less than the first charge threshold $V_1$, the controller 70 may continue activate an alarm to alert a user or passenger of the vehicle 10 of a warning condition (220). The alarm 314 is shown in FIG. 12 and may correspond to a device configured to output an audible and/or visual warning (e.g. a speaker and/or a light source). The controller 70 may further control the door actuator 22 to release the door 14 gradually from a held position (222). The held condition may correspond to any condition that the door actuator 22 applies force to adjust or hold a position the door 14.

While the controller 70 is controlling the door actuator 22 to release the door 14, the controller 70 may monitor the angular position ϕ of the door 14 to ensure that the door 14 does not exceed a movement threshold. The movement threshold may correspond to a threshold of an angular velocity of the door 14. The controller 70 may also monitor the angular position ϕ of the door 14 to identify when the door 14 is at rest (224). In response to the door 14 being at rest, the controller 70 may deactivate the alarm to notify the user or passenger of the vehicle 10 that the warning condition has passed (225). Additionally, the controller 70 may enter a recovery routine (226). The recovery routine may provide instructions to the user or passenger of the vehicle 10 of instructions to recover from a low battery or low charge condition or contact a service professional.

The method 170 may compare the charge level $V_S$ of the secondary power source 164 to various charge thresholds to determine a warning state for the door actuator 22. For example, the controller 70 may compare the charge level $V_S$ to a second charge threshold $V_2$ (228). The second charge threshold $V_2$ may be within a predetermined value of the minimum operational level of the charge level $V_S$. In an exemplary embodiment, second charge threshold $V_2$ may be approximately 10 V. In response to the controller 70 identifying that the charge level $V_S$ is less than the second charge threshold $V_2$, the controller 70 may activate the alarm to alert a user or passenger of the vehicle 10 of the warning condition (230). The controller 70 may further control the door actuator 22 to change the position of the door 14 periodically or oscillate the door 14 to generate a visual warning (232).

Once the oscillation of the door 14 is activated, the controller 70 may continue to output instructions to the door actuator 22 to control the position the door 14 until a positioning process or hold process is completed (234). Additionally, the controller 70 may return to step 216 to query the charge level $V_S$ of the secondary power source 164. Based on the charge level $V_S$ of the secondary power source 164, the controller 70 may continue to identify a control state as discussed herein.

The controller 70 may also compare the charge level $V_S$ to a third charge threshold $V_3$ (236). The third charge threshold $V_3$ may be within a predetermined value of the minimum operational level of the charge level $V_S$. In an exemplary embodiment, third charge threshold $V_3$ may be approximately 11 V. In response to the controller 70 identifying that the charge level $V_S$ is below the third charge threshold $V_3$, the controller 70 may activate the alarm to alert a user or passenger of the vehicle 10 of the warning condition (238). The controller 70 may then deactivate the oscillating motion of the door 14 (240). Additionally, the controller 70 may continue to step 234 to control the door actuator 22 until a positioning process or hold process is completed.

The controller 70 may further identify that the charge level $V_S$ is greater than the third charge threshold $V_3$. In response to the controller 70 identifying that the charge level $V_S$ is greater than the third charge threshold $V_3$, the controller 70 may de-activate the alarm (242). The controller 70 may then proceed to step 234 to output instructions to the door actuator 22 to control the position the door 14 until a positioning process or hold process is completed.

In some embodiments, the controller 70 may further be configured to utilize power from the central power source 162 to provide for operation of at least one door actuator 22 in the event that the charge level $V_S$ of the secondary power source 164 is diminished. For example, the controller 70 may supply energy from the central power source 162 to the secondary power source 164 in response to the charge level $V_S$ being less than one of the charge thresholds. For example, in response to the charge level $V_S$ being less than the first charge threshold $V_1$, the controller 70 may connect the central power source 162 to the secondary power source 164 such that the controller 70 may have sufficient energy to gradually release the door 14 from a held position as in step 222. In this way, the controller 70 may further provide for the prevention of unexpected failures of at least one door actuator 22.

As discussed herein, the method 170 may provide for a flexible control scheme that may include one or more comparisons to the plurality of charge levels or thresholds of the charge level $V_S$. In response to the controller 70 comparing the charge level $V_S$ to each of the plurality of charge thresholds, the controller 70 may activate various warnings and/or control states to communicate a status of the door actuator 22. By providing for the warnings and/or control states, the controller 70 may provide for effective operation of the door actuator 22 in various embodiments.

Figure 11:
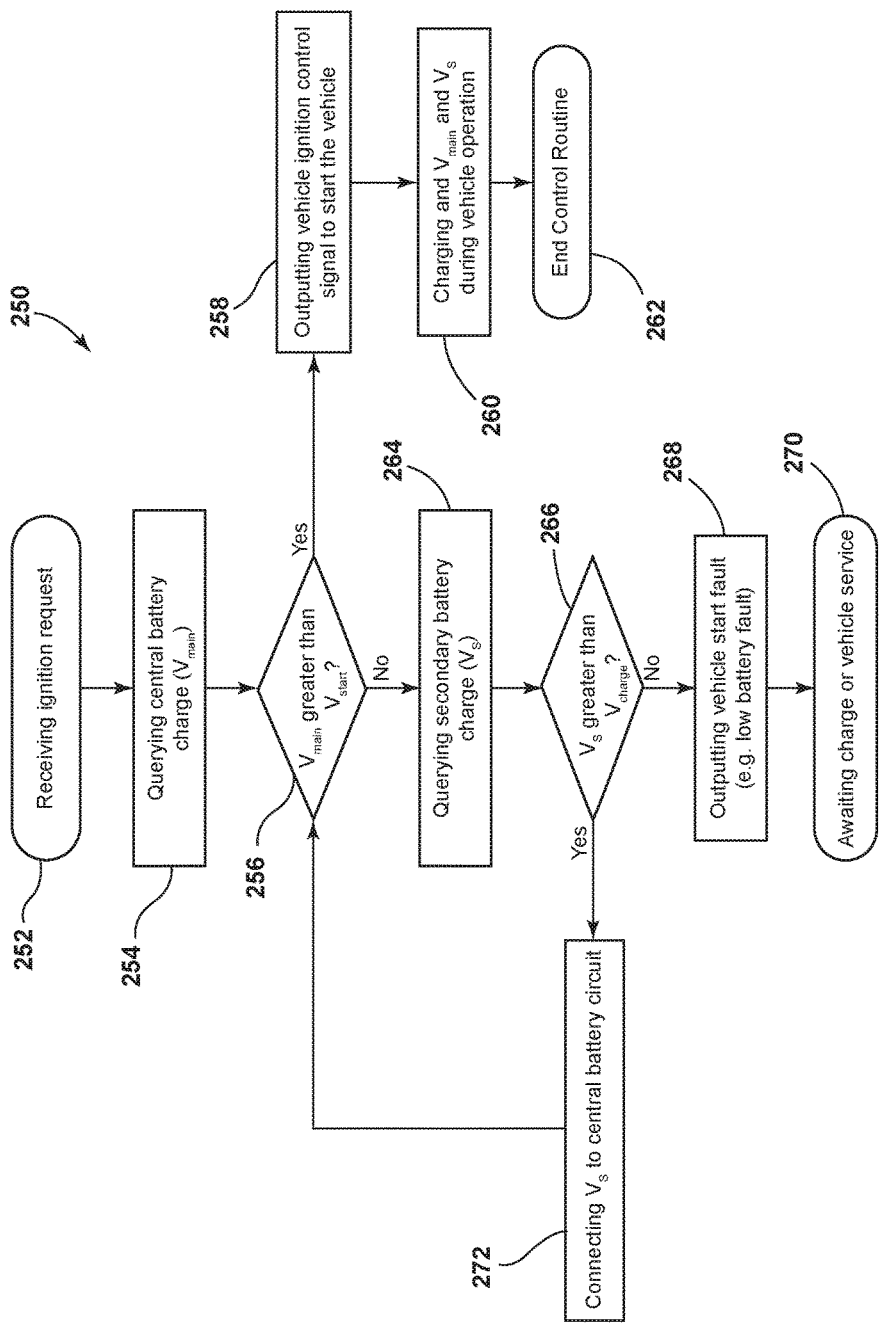
FIG. 11 is a flow chart of a power management routine configured to control an ignition event.

Referring now to FIG. 11, in some embodiments, the controller 70 may further be configured to utilize energy from the secondary power source 164 to assist the central power source 162 during an ignition event of the vehicle 10. FIG. 11 demonstrates a flow chart of an engine start control routine 250. The control routine 250 may begin in response to receiving an ignition request for the vehicle (252). In response to receiving the request, the controller 70 configured to query central power source 162 to identify the charge level $V_{main}$ of the central power source 162 (254). The controller 70 may then compare the charge level $V_{main}$ to a charge level required for ignition of the vehicle or a start voltage $V_{start}$ (256).

If the charge level $V_{main}$ of central power source 162 is greater than the start voltage $V_{start}$, the controller 70 may output a signal configured to cause the vehicle 10 to start the ignition utilizing the central power source 162 (258). The controller 70 may then connect the central power source 162 and the secondary power source 164 to the alternator or generator to charge during operation of the vehicle 10 (260). The start control routine 250 may then be completed for the ignition sequence (262).

If the charge level $V_{main}$ of central power source 162 is less than the start voltage $V_{start}$, the controller 70 may query the secondary power source 164 to determine the charge level $V_S$ (264). The controller 70 may then compare the charge level $V_S$ to determine if the charge level $V_S$ of the secondary power source 164 is greater than a voltage required to charge the central power source 162 or the charge voltage $V_{charge}$ (266). If the charge level $V_S$ is less than the charge voltage $V_{charge}$, the control routine may output a vehicle start fault to a display or gauge cluster of the vehicle 10 (268). Upon displaying the fault, the control routine may await a charge or vehicle service (270).

If in step 266 the charge level $V_S$ is greater than the charge voltage $V_{charge}$, the controller may connect the secondary power source 164 to the central power source 162 (272). With the secondary power source 164 supplying voltage to the central power source 162, the charge level $V_{main}$ may increase. The control routine 250 may then return to step 256 to determine if the charge level $V_{main}$ of central power source 162 is greater than the start voltage $V_{start}$. If the charge level $V_{main}$ of central power source 162 is greater than the start voltage $V_{strart}$ the controller 70 may continue to step 258, to start the vehicle 10. As described herein, the controller 70 provides for multiple beneficial applications of the central power source 162 and the at least one secondary power source 164 to provide for improved operation of the vehicle 10.

Figure 12:
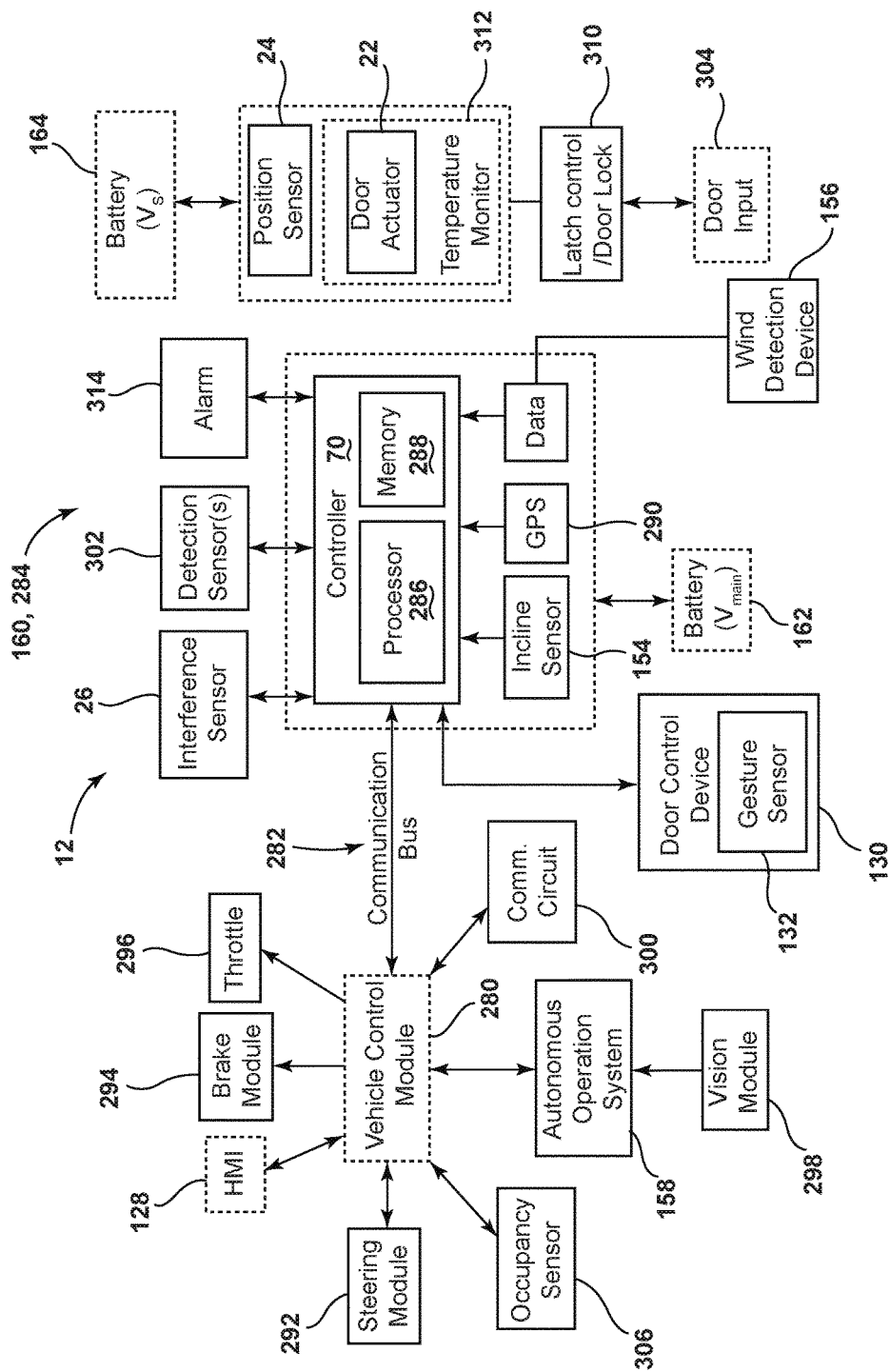
FIG. 12 is a block diagram demonstrating an exemplary embodiment of a door control system in accordance with the disclosure.

Referring now to FIG. 12, a block diagram of the door assist system 12 is shown. The door assist system 12 comprises the controller 70 in communication with the actuator 22 and configured to control the angular position ϕ of the door 14. The controller 70 may comprise a motor control unit having a feedback control system configured to accurately position the door 14 about the hinge assembly 18 in a smooth and controlled motion path. The controller 70 may further be in communication with a position sensor 24 as well as at least one interference sensor 26. The position sensor 24 is configured to identify an angular position ϕ of the door 14, and the interference sensor 26 is configured to identify a potential obstruction, which may prevent operation of the door assist system 12.

The controller 70 may be in communication with a vehicle control module 280 via a communication bus 282 of the vehicle 10 providing for a door control system 284. The communication bus 282 may be configured to deliver signals to the controller 70 identifying various vehicle states. For example, the communication bus 282 may be configured to communicate to the controller 70 a drive selection of the vehicle 10, an ignition state, an open or ajar status of the door 14, etc. The vehicle control module 280 may also communicate with the HMI 128 for implementation of the above-described learning and identification modes. The controller 70 may comprise a processor 286 comprising one or more circuits configured to receive the signals from the communication bus 282 and output signals to control the door assist system 12. The processor 286 may be in communication with a memory 288 configured to store instructions to control the activation of the door assist system 12.

The controller 70 is configured to control the actuator 22 to adjust the door from the opened position to the closed position and control the angular position $\phi$ of the door 14 therebetween. The actuator 22 may be any type of actuator that is capable of transitioning the door 14, including, but not limited to, electric motors, servo motors, electric solenoids, pneumatic cylinders, hydraulic cylinders, etc. The position sensor 24 may correspond to a variety of rotational or position sensing devices. In some embodiments, the position sensor 24 may correspond to an angular position sensor configured to communicate the angular position $\phi$ of the door to the controller 70 to control the motion of the actuator 22. The position sensor 24 may correspond to an absolute and/or relative position sensor. Such sensors may include, but are not limited to encoders, potentiometers, accelerometers, etc. The position sensor 24 may also correspond to optical and/or magnetic rotational sensors. Other sensing devices may also be utilized for the position sensor 24 without departing from the spirit of the disclosure.

The interference sensor 26 may be implemented by a variety of devices, and in some implementations may be utilized in combination with the actuator 22 and the position sensor 24 to detect and control the motion of the door 14. The interference sensor 26 may include various sensors utilized alone or in combination. For example, the interference sensor 26 may correspond to one or more capacitive, magnetic, inductive, optical/photoelectric, laser, acoustic/sonic, radar-based, Doppler-based, thermal, and/or radiation-based proximity sensors. Though particular devices are disclosed in reference to the exemplary embodiments of the interference sensor 26, it shall be understood that various sensor technologies known and yet to be discovered may be utilized to implement the door assist system 12 without departing from the spirit of the disclosure.

The controller 70 is further in communication with the door control device 130 comprising the gesture sensor 132. The gesture sensor 132 is configured to detect a motion or a gesture by an object 134 to activate the controller 70 to adjust the position of the door 14. The gesture sensor 132 may correspond to a variety of sensory devices. Sensory devices that may be utilized for the gesture sensor 132 may include, but are not limited to optical, capacitive, resistive, infrared, and surface acoustic wave technologies, as well as other proximity and sensor arrays or other elements for determining the gestures of the object 134 in proximity thereto.

The gesture sensor 132 may be utilized to detect and record a motion of an object and communicate motion data corresponding to the motion recorded by the gesture sensor 132 to the controller 70. The motion data may be communicated by a variety of analog or digital signals that may be utilized by the controller 70 to identify a gesture recorded by the gesture sensor 132. The motion data may be identified by the controller 70 to activate the door assist system 12 such that the actuator 22 repositions the door 14. The gesture to be identified by the controller 70 in order to activate the door assist system 12 may be predetermined or previously saved to the memory 288 of the controller 70. Upon receipt of the motion data, the controller 70 may compare the communicated motion data to the previously saved motion data to identify a gesture utilized to access the vehicle 10.

The controller 70 may comprise an incline sensor 154. The incline sensor 154 may correspond to a variety of sensors and in some implementations may correspond to a tilt sensor, accelerometer, gyroscope or any other device operable to measure the vehicle 10 oriented on an incline relative to gravity. The incline sensor 154 may communicate the incline of the vehicle 10 to the controller 70 such that when the door 14 is arranged in the opened position or a partially opened position, the controller 70 is configured to activate the actuator 22 to prevent the door 14 from swinging open, closing, or changing in the angular position $\phi$. In this way, the controller 70 may identify that the vehicle 10 is parked or oriented at an angle and prevent the door 14 from swinging under the force of gravity.

The controller 70 may also comprise a location module 290 or GPS device configured to receive positioning data and may also be configured to receive wireless data via a wireless data transceiver. The positioning data and/or the wireless data may be utilized to determine a location of the vehicle 10 and the weather conditions of that location. Based on the weather conditions and position of the vehicle 10, the controller 70 may be configured to identify periods when the door 14 may likely be unexpectedly repositioned or forced to swing about the hinge assembly 18 due to a wind gust or elevated wind speeds. The weather information may be accessed by the controller 70 via a communication circuit 300.

The communication circuit 300 may correspond to one or more circuits that may be configured to communicate via a variety of communication methods or protocols. For example, the communication circuit 300 may be configured to communicate in accordance with one or more standards including, but not limited to 3GPP, LTE, LTE Advanced, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

The controller 70 may be in communication with a wind detection device 156, for example an anemometer. The wind detection device 156 may be disposed on the vehicle 10 and configured to monitor the localized wind conditions proximate the vehicle 10. In response to a detection of windy conditions, the wind detection device 156 is configured to communicate wind condition data to the controller 70. In response to wind conditions or wind speeds exceeding a wind speed threshold, the controller 70 is configured to control the actuator 22 to prevent excess motion of the door 14 and/or dampen the motion of the door 14 about the hinge assembly 18.

The controller 70 may also further be in communication with an autonomous operation system 158. This may be achieved indirectly through the communication of controller 70 with vehicle control module 280, which may implement the functionality of autonomous operation system 158 or may be in communication therewith. Autonomous operation system 158 can receive data from a vision module 298 and from the location module 290 to determine a path for autonomous driving and can implement movement of vehicle 10 along such a path by communication with a vehicle steering module 292, a vehicle brake module 294, and the vehicle throttle 296. The communication of controller 70 with autonomous operation system 158 may allow autonomous operation system to receive data related to the angular position φ of door 14 relative to opening 20 or related to a condition of door 14 between an open condition and a closed condition such that autonomous movement of vehicle 10 is prevented when one or more doors 14 of vehicle 10 is in the open condition.

The controller 70 may further be in communication with various sensory devices that may support the operation of vehicle systems as discussed herein. For example, the controller 70 may be in communication with one or more detection sensors 302, a door input 304, and an occupancy sensor 306. The detection sensor 302 may correspond to a variety of sensory devices. For example, the detection sensor 302 may correspond to one of more proximity sensors, including, but not limited to radar, laser, ultrasonic, or other active sensors. In an exemplary embodiment, the at least one detection sensor 302 may correspond to an image based detection system (e.g. a camera system), which may comprise a plurality of imaging devices. In some embodiments, the imaging devices may correspond to the vision module 298.

The door input 304 may correspond to an electrical sensor and/or an electromechanical device configured to detect an input from a passenger attempting to exit the vehicle 10. For example, the door input 304 may correspond to a proximity sensor (e.g. capacitive, resistive, etc.), a switch or button, one or more input or detection circuits, etc. The door input 304 may be incorporated into and/or configured to provide control instructions for a latch control or door locking mechanism 310. In this configuration, the door input 304 may be incorporated in various embodiments to suit a desired application.

The occupancy sensor 306 may correspond to any form of sensor configured to identify an occupant in the vehicle 10. For example, the occupancy sensor 306 may correspond to one or more of an ultrasonic sensor, an infrared sensor, a microphone, an imaging device, a weight sensor, and various other forms of sensors. The occupancy sensor 306 may provide for the detection of the one or more occupants, and in some embodiments, the controller 70 may utilize occupancy data received from the occupancy sensor 306 to identify a location of an occupant in the vehicle 10. In this configuration, the controller 70 may identify a door 14 corresponding to the location of the occupant and control the identified door in response an automatic or power operation of the door 14.

The door control system 284 may be supplied electrical power from one or more power sources. For example, power sources may comprise a central power source 162 conductively connected to a starter, an alternator, a generator, one or more electric motors, and/or various electrical systems. Additionally, the door control system 284 may be supplied power by one or more secondary power sources 164. The secondary power sources 164 may typically be utilized in addition to the central power source 162 and may provide electrical energy to the door actuators 22. In some embodiments, each of the door actuators 22 may each be configured to draw power from a dedicated secondary power source 164. In such embodiments, one or more of the secondary power sources 164 may be interconnected or may function independently. Accordingly, each of the power sources 162 and 164 may be configured to function independently and or in various combinations to provide electrical current to the various electrical systems of the vehicle 10 and/or the door actuators 22.

The controller 70 may further be configured to determine a temperature of the door actuators via a temperature monitor 312. The temperature monitor 312 may correspond to a sensor and/or a circuit integrated into the door actuator 22. For example, temperature monitor 312 may correspond to a Resistance Temperature Device (RTD), a thermocouple, or various forms of temperature sensors or circuits. In some embodiments the door actuator 22 may correspond to an electric motor, and the temperature monitor 312 may utilize a resistance of the electric motor to determine the temperature.

The controller 70 may further be in communication with an alarm 314. The alarm 314 may correspond to a device configured to output an audible and/or visual warning (e.g. a speaker and/or a light source). In some embodiments, the alarm 314 may be configured to output an audible tone and/or auditory instructions for a passenger of the vehicle 10. As discussed herein, the door control system 284 may provide for various functions and components that may improve operation and interaction with various vehicles.

For the purposes of describing and defining the present teachings, it is noted that the terms "substantially" and "approximately" are utilized herein to represent the inherent degree of uncertainty that may be attributed to any quantitative comparison, value, measurement, or other representation. The term "substantially" and "approximately" are also utilized herein to represent the degree by which a quantitative representation may vary from a stated reference without resulting in a change in the basic function of the subject matter at issue.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle door system comprising:
   an actuator configured to adjust a position of a door;
   a power source; and
   a controller configured to control the actuator with energy provided by the power source, wherein the controller is configured to:
      identify a charge level of the power source;
      compare the charge level to at least one threshold; and
      in response to the charge level being less than the at least one threshold, control the actuator to release the door, wherein the controller controls the actuator limiting a rate of motion of the door after the release, wherein the at least one threshold of the charge level is sufficient to supply operating energy to the actuator to complete the limiting of the rate of motion of the door after the release over the rotational path of the door to a rest position.

2. The vehicle door system according to claim 1, further comprising a position sensor configured to identify a position of the door and communicate the position to the controller.

3. The vehicle door system according to claim 1, wherein the controller is configured to control at least one of an audible alert and a visual alert in response to the release of the door.

4. The vehicle door system according to claim 1, wherein the controller is further configured to:
control the actuator moving the position a plurality of times in response to the charge level being less than a second threshold corresponding to the at least one threshold.

5. The vehicle door system according to claim 4, wherein the moving of the door a plurality of times corresponds to an oscillating motion of the door by the actuator controlled by the controller.

6. The vehicle door system according to claim 4, wherein the controller is further configured to:
control the actuator to output the warning signal in response to the actuator temperature exceeding a third threshold corresponding to the at least one threshold.

7. The vehicle door system according to claim 1, further comprising an alarm configured to output at least one of an audio and a visual alert in response to the warning signal.

8. A vehicle door control system comprising:
a door actuator in communication with a power supply; and
a controller configured to control the door actuator by:
identifying a charge level of the power supply; and
in response to the charge level being less than a first threshold, controlling the door actuator to move the door in an oscillating motion.

9. The vehicle door control system according to claim 8, wherein the door actuator corresponds to an electrical motor.

10. The vehicle door control system according to claim 8, further comprising a position sensor configured to identify a position of the door and communicate the position to the controller.

11. The vehicle door control system according to claim 10, wherein the controller is further configured to:
in response to the charge level being less than a second threshold, controlling the door actuator to release the door.

12. The vehicle door control system according to claim 11, wherein the controller is further configured to:
detect a position of the door from the position sensor such that the door is released while limiting a rate of motion of the door.

13. The vehicle door control system according to claim 10, wherein the controller is further configured to:
in response to the charge level being less than a third threshold, outputting an alert signal configured to control an alert device to output at least one of an audio and a visual warning.

14. The vehicle door system according to claim 1, wherein limiting the rate of motion comprises controlling a rate of change of an angular orientation of the door relative to the vehicle.

15. The vehicle door system according to claim 14, wherein the controlling the rate of change of the angular orientation is maintained until the door is at rest.

* * * * *